(12) United States Patent
Matsumoto et al.

(10) Patent No.: US 7,372,514 B2
(45) Date of Patent: May 13, 2008

(54) ACTIVE MATRIX TYPE DISPLAY DEVICE HAVING ANTISTATIC LINES USED AS REPAIR LINES

(75) Inventors: Shinzo Matsumoto, Mobara (JP); Kunihiko Watanabe, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 266 days.

(21) Appl. No.: 11/066,237

(22) Filed: Feb. 25, 2005

(65) Prior Publication Data

US 2005/0195338 A1    Sep. 8, 2005

(30) Foreign Application Priority Data

Mar. 3, 2004    (JP)    ............................ 2004-058545

(51) Int. Cl.
*G02F 1/1333*    (2006.01)

(52) U.S. Cl. ............................. 349/55; 349/54; 349/40; 349/149; 349/150; 349/151

(58) Field of Classification Search ................. 349/40, 349/54, 55, 149, 150, 151
See application file for complete search history.

(56) References Cited

U.S. PATENT DOCUMENTS

| | | | | |
|---|---|---|---|---|
| 6,025,891 | A * | 2/2000 | Kim ............................. | 349/40 |
| 6,111,621 | A * | 8/2000 | Kim et al. .................... | 349/54 |
| 6,613,650 | B1 * | 9/2003 | Holmberg ................... | 438/438 |
| 2002/0044251 | A1 * | 4/2002 | Togashi et al. ............. | 349/149 |
| 2004/0150765 | A1 * | 8/2004 | Ueda et al. .................. | 349/54 |

* cited by examiner

*Primary Examiner*—Andrew Schechter
*Assistant Examiner*—Matthew Tynan
(74) *Attorney, Agent, or Firm*—Reed Smith LLP; Stanley P. Fisher, Esq.; Juan Carlos A. Marquez, Esq.

(57) ABSTRACT

An active matrix type display device includes inter-pad short-circuiting lines which are connected with signal lines, terminal portions which transmit signals from an IC chip to the signal lines, and a plurality of short-circuiting lines which are arranged outside the terminal portions and inside an end surface of a substrate and are connected with a plurality of inter-pad short-circuiting lines, wherein cut regions of the inter-pad short-circuiting lines are arranged outside the terminal portions and inside the short-circuiting lines. Since repair lines and signal-line lead line do not cross each other, it is possible to perform the highly reliable repair in respective manufacturing steps.

18 Claims, 23 Drawing Sheets

ACTIVE MATRIX TYPE DISPLAY DEVICE HAVING ANTISTATIC LINES USED AS REPAIR LINES

BACKGROUND OF THE INVENTION

1. Field of the Invention

The present invention relates to an active matrix type display device, and more particularly to an active matrix type display device and a manufacturing method thereof in which, in forming pixels having thin film transistors (TFT) in a matrix array on an insulation substrate which is constituted of a bendable substrate such as a substrate which forms an insulation film on a glass substrate, a plastic sheet (a PES (Polyethersulfone) film or the like) or a steel foil, the display device exhibits the sufficient resistance against electrostatic stress, enables sufficient repair with high reliability using repair lines even when a signal line is disconnected, and realizes light-weighted and compact mounting in combination with chip-on-glass (COG) mounting.

2. Description of the Related Art

Hereinafter, as a display panel which constitutes an active matrix type display device, the explanation is made using a liquid crystal panel as an example. FIG. 24 is a schematic plan view of a TFT substrate of the liquid crystal panel. On the TFT substrate 1, gate signal lines 30 and drain signal lines 40 are formed. On an upper side of the drawing shown in FIG. 24, extension lines 41 which extend from the drain signal lines 40 cross a repair line 43 by way of an insulation film. On a lower side of the drawing shown in FIG. 24, conventional repair lines 400 cross lead lines 402 which extend from the drain signal lines 40 by way of an insulation film. On a peripheral portion of the substrate 1, tape carrier packages (TCP) 410 on which drive ICs are mounted are electrically connected with the gate signal lines 30 and the drain signal lines 40. Further, a vertical scanning circuit, a video signal drive circuit, a power source circuit and a signal conversion circuit which are usually constituted of a printed circuit board 430 convert various signals from a host computer and supply the signals to the above-mentioned substrate.

Conventionally, when a disconnection defective portion 22 occurs in the midst of the signal line, lines arranged on different layers are electrically connected with each other using laser beams. In the drawing, laser beams are radiated once or several times to two portions indicated as portions 26 arranged on an upper side and a lower side of the substrate thus ensuring the electrical connection between the repair line and the signal line.

A signal supply path 91 after repairing allows a drive signal from the TCP 410 to turn around a connection terminal (not shown in the drawing) with the TCP line, the lead line 402 of the signal line, the portion 26 at which the lines arranged on different layers are electrically connected with each other by laser beams, the repair line 400, a connection terminal portion (not shown in the drawing) of the repair line, the repair line 401 in the inside of the TCP, a repair line 401 in the inside of the video signal drive circuit, a flexible printed circuit board (FPC board) 420 for line connection, a repair line 401 in the inside of the vertical scanning circuit line, a FPC 420 for line connection, the repair line 43, the portion 26, and the line 41 which extends from the drain signal line on the substrate and hence, the drive signal is supplied to the upper-side signal lines 40 from the disconnection defective portion 22.

Further, short-circuiting lines for static electricity which are provided for short-circuiting the plurality of gate signal lines 30 and the plurality of drain signal lines 40 with each other are cut and removed from the substrate in the course of manufacturing steps.

Further, FIG. 25 is an explanatory view showing the cutting of the substrate of the conventional liquid crystal panel. As shown in FIG. 25, in the conventional liquid crystal panel, to electrically separate the short-circuiting line 7 for static electricity from the gate signal lines 30 and the drain signal lines 40, scribe lines 8 are formed at many portions and, thereafter, an outer peripheral portion of the substrate (a substrate discarding portion) 600 is cut and removed after passing through a large number of steps such as reversing and transfer of the substrate, cutting of the substrate, horizontal parallel transfer, formation of the scribe lines, reversing and transfer, and cutting of the substrate. Here, numeral 500 indicates a TFT array portion (pixel matrix portion, a display region). As documents which disclose this type of related art, Japanese Patent No. 3167633, Japanese Patent No. 3315834 and JP-A-9-244048 are named.

SUMMARY OF THE INVENTION

An active matrix type display device includes inter-pad short-circuiting lines which are connected with signal lines for supplying signals to TFTs, terminal portions which transmit signals from an IC chip to the signal lines, and short-circuiting lines which are provided outside the terminal portions and inside an end surface of the substrate and are connected with the plurality of inter-pad short-circuiting lines, wherein cut regions for the inter-pad short-circuiting lines are arranged outside the terminal portions and inside the short-circuiting lines.

Since repair lines and signal-line lead lines do not cross each other, it is possible to perform the highly reliable repair in respective steps constituted of a TFT manufacturing step, a panel manufacturing step and a module manufacturing step.

As described above, the conventional display device which is constituted of the display panel on which the pixels having TFTs are arranged in a matrix array has following drawbacks.

(1) The display panel includes many portions where repair lines cross input lines to the TFTs and hence, the signal delay is increased due to the influence of crossing capacitances thus giving rise to the abnormal display. Further, there may arise a situation in which the highly reliable repair becomes impossible in the module (MD) manufacturing step.

(2) Since the outer periphery is cut and removed in the course of the panel manufacture, the display panel exhibits the structure which is fragile to the electrostatic stress in the succeeding step. Particularly, in the polarizer lamination step and the drive IC (COG) mounting step, since the short-circuiting lines for static electricity are not provided, there may arise a possibility that a TFT line pattern is disconnected, short-circuiting occurs between patterns or a threshold value voltage of the thin film transistor fluctuates.

(3) Since the substrate is cut through a large number of steps, a mechanical stress is imparted to the remaining substrate or a mechanical stress which remains on the substrate is alleviated at the time of cutting the substrate, cracks occur at end portions of the substrate or a partial disconnection occurs at a terminal portion or a wiring portion attributed to a foreign substance at the time of cutting the substrate.

Further, such an operation pushes up a manufacturing cost and also requires a considerable time.

(4) Since portions of the substrate to be removed are relatively large, the treatment for discarding or recycling the waste substrate becomes necessary.

According to the present invention, it is possible to obtain following advantageous effects.

(1) Since the repair lines and signal-line lead lines do not cross each other, it is possible to provide the highly reliable repair in respective steps constituted of the TFT manufacturing step, the panel manufacturing step and the module manufacturing step.

(2) Since the short-circuiting lines remain on the substrate and hence, defects which may be caused by electric stress such as electrostatic charge or mechanical stress such as cutting can be reduced.

(3) There exist hardly portions of the substrate to be removed and hence, recycling is unnecessary. In case of a large-sized panel which can only take one panel from each substrate, cutting of the substrate can be completely eliminated.

(4) With the adoption of the COG mounting method, it is possible to reduce a raw manufacturing cost and compact mounting.

An active matrix type display device includes inter-pad short-circuiting lines which are connected with signal lines for supplying signals to TFTs, terminal portions which transmit signals from an IC chip to the signal lines, and short-circuiting lines which are provided outside the terminal portions and inside an end surface of the substrate and are connected with the plurality of inter-pad short-circuiting lines, wherein cut regions for the inter-pad short-circuiting lines are arranged outside the terminal portions and inside the short-circuiting lines.

Since repair lines and signal-line lead lines do not cross each other, it is possible to perform the highly reliable repair in respective steps constituted of a TFT manufacturing step, a panel manufacturing step, and a module manufacturing step.

To enumerate representative constitutions of the present invention, they are as follows.

First of all, typical constitutions with respect to the active matrix type display device of the present invention are described.

(1) The active matrix type display device includes:
an insulation substrate;
a display part which is constituted of a plurality of thin film transistors and a plurality of signal lines which supply signals to the thin film transistors which are arranged in a matrix array on the substrate;
a plurality of input lines which supply electric signals to the plurality of signal lines;
an IC chip for driving the thin film transistors which is formed on the substrate and is electrically connected with the plurality of input lines using chip-on-glass mounting;
inter-pad short-circuiting lines which are electrically connected with the respective input lines and pass below the IC chip; and
short-circuiting lines which are arranged outside a region where the IC chip is mounted and inside an end surface of the substrate, and electrically connect the inter-pad short-circuiting lines with each other, wherein
a cut region which cuts the electric connection between the plurality of inter-pad short-circuiting lines and the short-circuiting lines is arranged outside the IC chip and inside the short-circuiting lines.

(2) The active matrix type display device includes:
an insulation substrate;
a display part which is constituted of a plurality of thin film transistors and a plurality of signal lines which supply signals to the thin film transistors which are arranged in a matrix array on the substrate;
a plurality of input lines which supply electric signals to the plurality of signal lines;
an IC chip for driving the thin film transistors which is formed on the substrate and is electrically connected with the plurality of input lines using chip-on-glass mounting;
connection pads being connected with the IC chip which are formed on the substrate;
inter-pad short-circuiting lines which are electrically connected with the respective input lines and pass below the IC chip;
short-circuiting lines which are arranged inside an end surface of the substrate and electrically connect the inter-pad short-circuiting lines with each other; and
a cut region which cuts the electric connection between the plurality of inter-pad short-circuiting lines and the short-circuiting lines is arranged between the connection pads and the short-circuiting lines, and
the display panel includes connection terminal portions which are provided for electrically connecting FPC lines with the short-circuiting lines.

(3) The active matrix type display device includes:
an insulation substrate;
a display part which is constituted of a plurality of thin film transistors and a plurality of signal lines which supply signals to the thin film transistors which are arranged in a matrix array on the substrate;
a plurality of input lines which supply electric signals to the plurality of signal lines;
terminal portions which electrically connects a flexible board on which an IC chip for driving the thin film transistors is mounted and the plurality of input lines;
inter-pad short-circuiting lines which are electrically connected with the respective input lines and are arranged outside the terminal portions; and
short-circuiting lines which are arranged outside the terminal portions and inside an end surface of the substrate, wherein
a cut region where the electric connection between the plurality of inter-pad short-circuiting lines and the short-circuiting lines is cut is arranged outside the terminal portions and inside the short-circuiting lines.

(4) In the active matrix type display device having any one of the above-mentioned constitutions (1) to (3), the short-circuiting lines are short-circuiting lines for static electricity or branched short-circuiting lines.

(5) In the active matrix type display device having any one of the above-mentioned constitutions (1) to (3), the above-mentioned FPC is laminated to cover the short-circuiting lines or to cover the short-circuiting lines and the cut region.

(6) In the active matrix type display device having any one of the above-mentioned constitutions (1) to (3), an inter-line connection pattern of a flexible printed circuit board is further formed on the substrate.

(7) In the active matrix type display device having the above-mentioned constitution (4), the branched short-circuiting line has a U-shape.

(8) In the active matrix type display device having any one of the above-mentioned constitutions (1) to (3), the short-circuiting lines are formed of a plurality of lines, wherein the number of lines of each color is equal to the number of lines of other respective colors.

(9) In the active matrix type display device having any one of the above-mentioned constitutions (1) to (3), the cut is performed except for the inter-pad short-circuiting lines which are electrically connected with the signal lines which require the repair.

(10) The active matrix type display device includes:
an insulation substrate;
a display part which is constituted of a plurality of thin film transistors and a plurality of signal lines which supply signals to the thin film transistors which are arranged in a matrix array on the substrate;
a plurality of input lines which supply electric signals to the plurality of signal lines;
an IC chip for driving the thin film transistors which is formed on the substrate and is electrically connected with the plurality of input lines using chip-on-glass mounting;
inter-pad short-circuiting lines which are electrically connected with the respective input lines and pass below the IC chip; and
short-circuiting lines which are arranged outside a region where the IC chip is mounted and inside an end surface of the substrate, and electrically connect the inter-pad short-circuiting lines with each other, wherein
a cut region which cuts the electric connection between the plurality of inter-pad short-circuiting lines and the short-circuiting lines is arranged outside a region where the IC chip is mounted and inside the short-circuiting lines,
the short-circuiting lines and extension lines which are connected with the signal lines are formed outside a sealing portion of the substrate, and
the signal lines to be repaired are electrically connected with the short-circuiting lines using a metal complex.

(11) In the active matrix type display device having the above-mentioned constitutions (10), the short-circuiting lines are formed of a plurality of lines, wherein the number of lines of each color is equal to the number of lines of other respective colors.

(12) In the active matrix type display device having the above-mentioned constitutions (11), inspection pads which correspond to the plurality of respective colors are formed on portions of the plurality of short-circuiting lines.

(13) An active matrix type display device includes a plurality of drain signal lines, a plurality of gate signal lines which cross the drain signal lines and thin film transistors which are formed in the vicinity of crossing portions of the drain signal lines and the gate signal lines in the inside of a display region on an insulation substrate, wherein the active matrix display device further includes:
a terminal portion which is formed on the substrate outside the display region and on which an IC chip for driving which supplies electric signals to the plurality of drain signal lines or the plurality of gate signal lines is mounted;
inter-pad short-circuiting lines which pass below the IC chip and are electrically connected with the terminal portion;
short-circuiting lines for static electricity which are positioned on a terminal end side of the substrate than the inter-pad short-circuiting lines;
a cut portion which cuts the electric connection between the inter-pad short-circuiting lines and the short-circuiting lines for static electricity except for specific lines out of the plurality of drain signal lines or the plurality of gate signal lines;
repair lines which cross extension lines of the plurality of drain signal lines or extension lines of the plurality of gate signal lines by way of an insulation layer; and
connection portions where the repair lines and the extension lines of the specific signal lines are electrically connected using laser beams, wherein
the electric connection between the specific signal lines and the repair lines and the electric connection between the specific signal lines and the short-circuiting lines for static electricity can be established.

(14) An active matrix type display device includes a plurality of drain signal lines, a plurality of gate signal lines which cross the drain signal lines and thin film transistors which are formed in the vicinity of crossing portions of the drain signal lines and the gate signal lines in the inside of a display region on an insulation substrate, wherein the active matrix display device further includes:
a terminal portion which is formed on the substrate outside the display region and to which an external driving circuit which supplies electric signals to the plurality of drain signal lines or the plurality of gate signal lines is mounted;
inter-pad short-circuiting lines which are positioned closer to the end surface side of the substrate than the terminal portion and are electrically connected with the terminal portion;
short-circuiting lines for static electricity which are positioned on a further terminal end side of the substrate than the inter-pad short-circuiting lines;
a cut portion which cuts the electric connection between the inter-pad short-circuiting lines and the short-circuiting lines for static electricity except for specific lines out of the plurality of drain signal lines or the plurality of gate signal lines;
repair lines which cross extension lines of the plurality of drain signal lines or extension lines of the plurality of gate signal lines by way of an insulation layer; and
connection portions where the repair lines and the extension lines of the specific signal lines are electrically connected using laser beams, wherein
the electric connection between the specific signal lines and the repair lines and the electric connection between the specific signal lines and the short-circuiting lines for static electricity can be established.

Further, typical constitutions with respect to the manufacturing method of the active matrix type display device are described as follows.

(15) The manufacturing method of the active matrix type display device includes the steps of
forming a plurality of gate signal lines and a plurality of drain signal lines which cross the gate signal lines in the inside of a display region on an insulation substrate, forming thin film transistors in the vicinities of crossing portions of the drain signal lines and the gate signal lines, forming terminal portions, inter-pad short-circuiting lines and short-circuiting lines on the substrate outside the display region,
mounting an external drive circuit for supplying electric signals to the plurality of drain signal lines and the plurality of gate signal lines to the terminal portion on the substrate outside the display region; and
cutting the electric connection between the inter-pad short-circuiting line and the short-circuiting line by radiating laser beams to the plurality of drain signal lines and the plurality of gate signal lines except for the specific signal lines.

(16) The manufacturing method of the active matrix type display device includes the steps of forming a plurality of gate signal lines and a plurality of drain signal lines which cross the gate signal lines in the inside of a display region on an insulation substrate, forming thin film transistors in the vicinities of crossing portions of the drain signal lines and the gate signal lines, forming terminal portions, inter-pad short-circuiting lines and short-circuiting lines on the substrate outside the display region, mounting an external drive circuit for supplying electric signals to the plurality of drain signal lines and the plurality of gate signal lines to the terminal portion on the substrate outside the display region;

cutting the electric connection between the inter-pad short-circuiting line and the short-circuiting line by radiating laser beams, and performing the electric connection between the inter-pad short-circuiting lines and the short-circuiting lines which are electrically connected with specific signal lines out of the plurality of drain signal lines and the plurality of gate signal lines using a material made of metal complex.

Further, the active matrix type display device according to the present invention is characterized by having the following constitution.

(17) In any one of the active matrix type display devices described in (1), (2), (3), (10), (13) and (14), the insulation substrate is formed of a glass substrate or a bendable substrate.

(18) In the manufacturing method of the active matrix type display device described in any one of (15) and (16), a glass substrate or a bendable substrate is used as the insulation substrate.

(19) In an active matrix type display device which includes an image display region and a peripheral region which surrounds the image display region on an insulation substrate, and further includes a plurality of thin film transistors which are arranged in the image display region, a plurality of signal lines which supply signals to the thin film transistors and connection pads which are arranged in the peripheral region and are connected with the signal lines, the peripheral region of the insulation substrate includes short-circuiting lines which are arranged to face an end surface of the substrate outside the connection pads and inter-pad short-circuiting lines which extend toward an end portion of the insulation substrate from the connection pads and are connected with the short-circuiting lines, and the inter-pad short-circuiting lines have cut regions.

(20) In the active matrix type display device of the above-mentioned (19), the display device includes an IC-chip-use input pad, input lines which supply signals to input pads and connecting portions between the input lines and FPC on a peripheral region of the insulation substrate, an IC chip for driving thin film transistors is arranged on the substrate by chip-on-glass mounting, and output terminals of the IC chip and the connection pads are connected with each other and, at the same time, the input pads and input terminals of the IC chip are connected with each other, and the connecting portions are formed inside the short-circuiting lines.

Due to such a constitution, according to the present invention, it is possible to leave the outside short-circuiting lines for static electricity besides the inter-pad short-circuiting lines on the final substrate. Then, immediately before performing the final inspection, the inter-pad short-circuiting lines are separated from the short-circuiting lines for static electricity. Here, the inter-pad short-circuiting lines pass through below the drive circuit chip (IC chip) and hence, the laser cutting portions are arranged outside the region where the IC chip is mounted.

The repaired portions are not cut by laser beams or partially connected using the metal complex after cutting. The anti-electrolytic corrosion measure is taken by laminating the flexible printed circuit board (FPC substrate) (ACF coating) to the cut portions or coating resin to the cut portions. Simultaneously with the resin coating applied to the periphery of the semiconductor integrated circuit (IC chip) of the drive circuit, the resin is also applied to the cut portions. Here, the FPC is laminated to cover the short-circuiting lines for static electricity in the peripheral portion. At the same time, it is also possible to make use of the inter-FPC connecting pattern.

Since the repair lines on the IC chip mounting side for driving do not cross the signal pull-out lines, the crossing capacitance is decreased, the signal delay of the repair liens is decreased, and a large number of repair lines can be formed. Further, since the short-circuiting lines remain on the substrate, the defect attributed to stress generated by static electricity is reduced. Further, since the number of substrate cut portions is reduced, the defect attributed to the mechanical stress generated by damages of terminal portions or the like can be reduced and hence, a waste glass amount can be largely reduced. Still further, in combination with the COG mounting, the active matrix type display device can realize the light-weighted and compact mounting.

DESCRIPTION OF THE PREFERRED EMBODIMENTS

The embodiments of the present invention are explained in detail hereinafter in conjunction with attached drawings.

Embodiment 1

Figure 1:
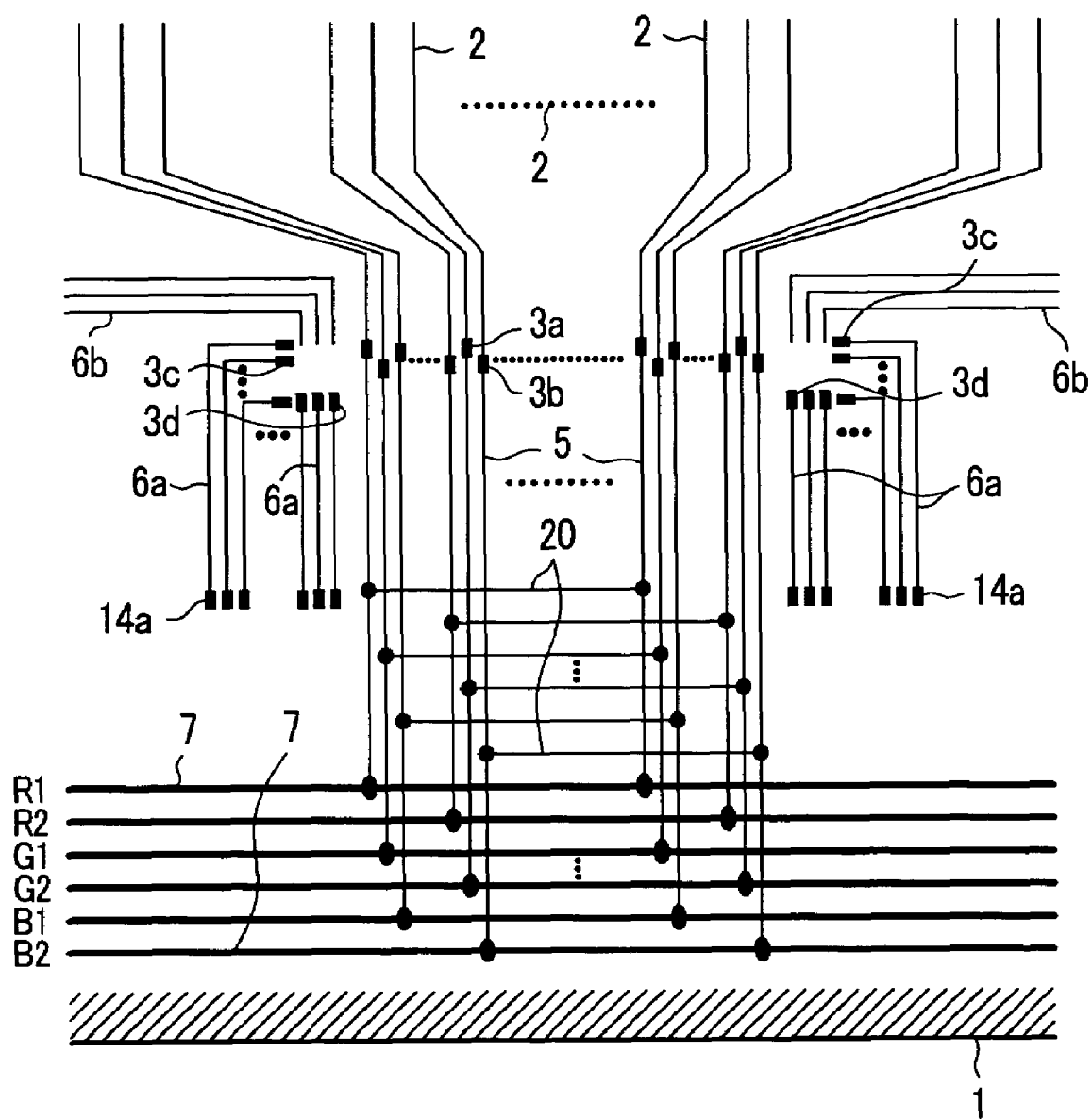
FIG. 1 is a plan view of an essential part of a transparent insulation substrate which constitutes a liquid crystal panel of an active matrix type liquid crystal display device of the present invention.
Figure 27:
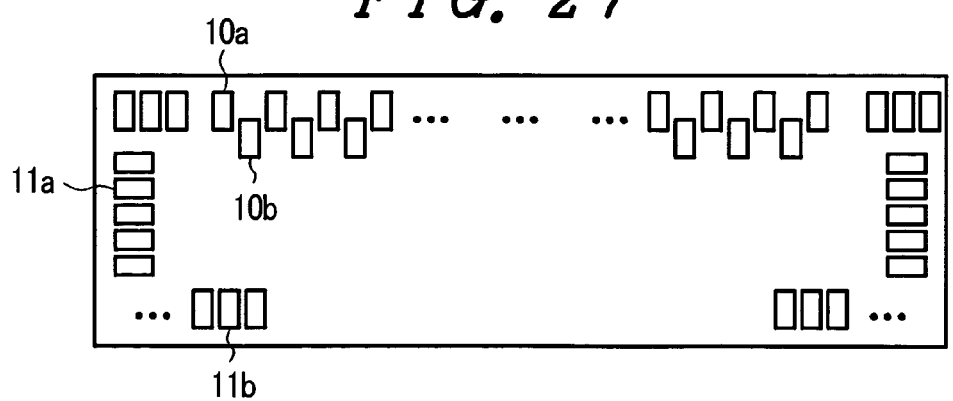
FIG. 27 is a plan view of a surface on which input terminals and output terminals of an IC chip are formed.
Figure 24:
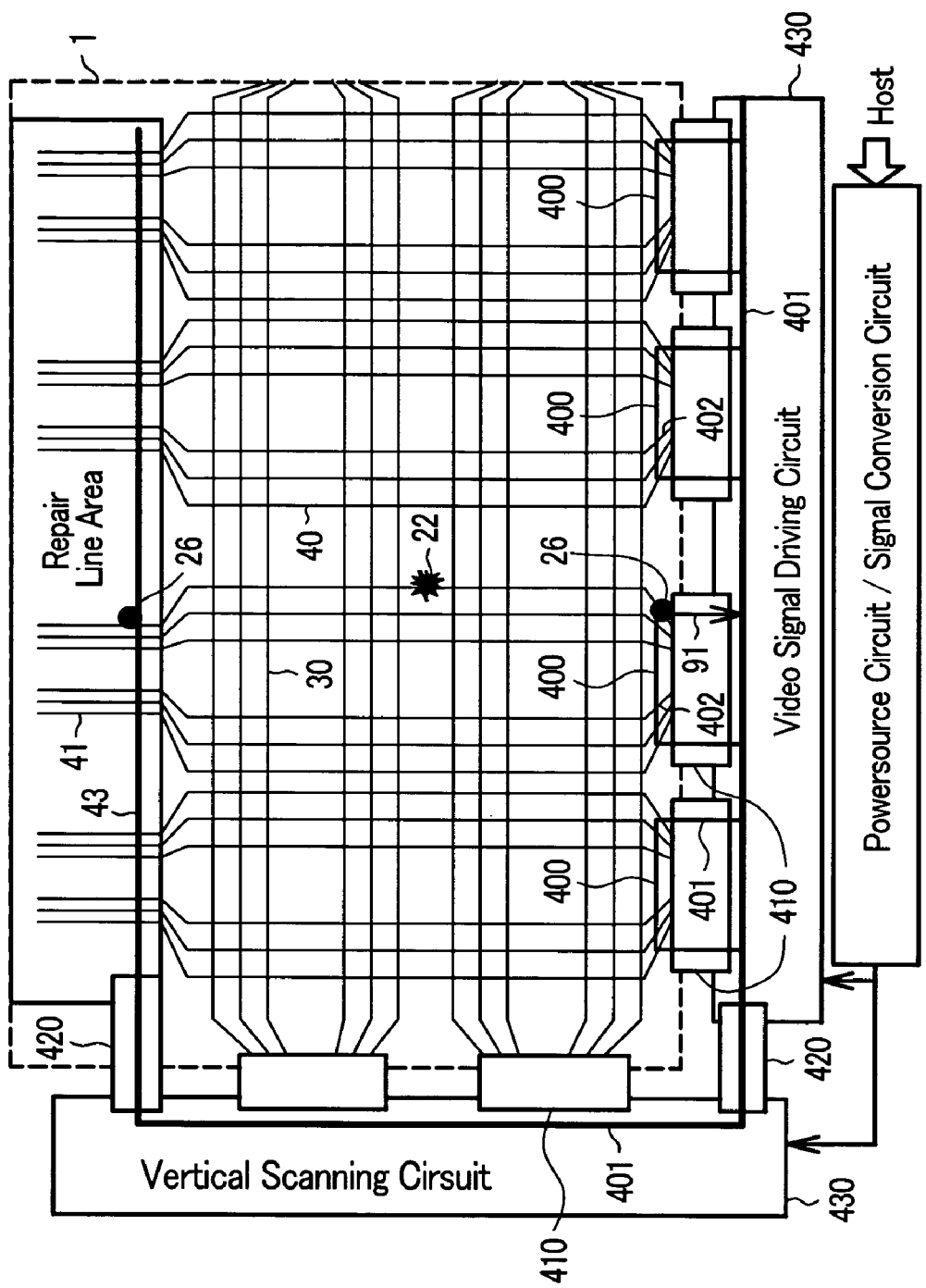
FIG. 24 is an explanatory view of a conventional liquid crystal panel and a peripheral circuit.

FIG. 1 is a plan view of an essential part of a transparent insulation substrate which constitutes a liquid crystal panel of an active matrix type liquid crystal display device of the present invention. FIG. 27 is a plan view of a terminal forming surface of an IC chip. Numeral 1 indicates the transparent insulation substrate (preferably a glass substrate and also simply referred to as an insulation substrate, further, also referred to as a thin film transistor substrate, a TFT substrate) which constitutes one substrate. Numeral 2 indicates input lines which are provided for thin film transistors (TFT), numerals 3a, 3b indicate connection pads to which output terminals 10a, 10b of the IC chip are connected, numerals 3c, 3d indicate input pads to which input terminals 11a, 11b of the IC chip are connected, numeral 5 indicates inter-pad short-circuiting lines, numeral 6a indicates input lines which are provided for a semiconductor integrated circuit (an IC chip) of a drive circuit, numeral 6b indicates signal transmission lines between semiconductor integrated circuits (IC chips) of neighboring drive circuits, numeral 7 indicates short-circuiting lines for static electricity (two lines (R1, R2, G1, G2, B1, B2) for each of three colors (red R, green G, blue B)). Numeral 14a indicates connection portions with FPC for transmitting signals from the outside to the IC chip, and numeral 20 indicate branched short-circuiting lines (for every R, G, B) which are branched from the short-circuiting lines 7 for static electricity.

Figure 2:
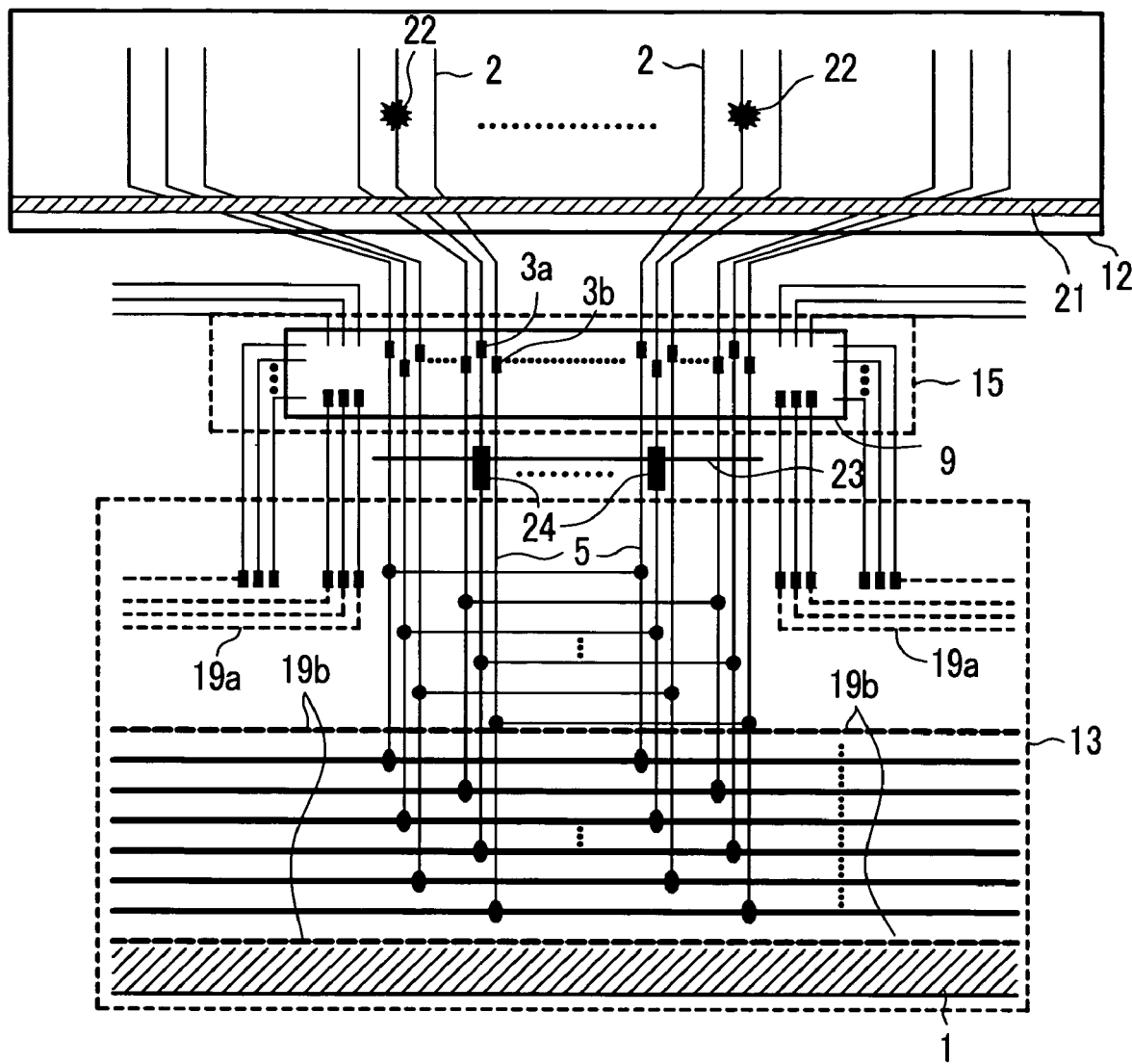
FIG. 2 is a plan view of an essential part showing a state in which the repair is conducted on the insulation substrate shown in FIG. 1 using a metal complex, an IC chip and a flexible printed circuit board are mounted on the insulation substrate and a transparent insulation substrate which constitutes another substrate is laminated to the insulation substrate.

Further, FIG. 2 is a plan view of an essential part showing a state in which the repair is conducted on the insulation substrate shown in FIG. 1 using a metal complex, an IC chip and a flexible printed circuit board are mounted on the insulation substrate and a transparent insulation substrate which constitutes another substrate is laminated to the insulation substrate. In FIG. 2, the same numerals indicate parts having identical functions as the parts shown in FIG. 1. Another substrate 12 is also preferably formed of a glass substrate. Further, numeral 9 indicates the IC chip, numeral 13 indicates the flexible printed circuit board (the FPC board), numeral 15 indicates an anisotropic conductive film (ACF), numerals 19a, 19b indicate FPC-side lines, numeral 21 indicates a sealing portion, numeral 22 indicates cut defective portions, numeral 23 indicates a portion cut by laser beams, and numeral 24 indicates a portion repaired by a metal complex.

The liquid crystal panel of the embodiment 1 includes a display part which is constituted of a plurality of thin film transistors and a plurality of signal lines which supply signals to the thin film transistors which are arranged on the insulation substrate 1 in a matrix array. The liquid crystal panel also includes a plurality of input lines which supply electric signals to the plurality of signal lines. Here, on the insulation substrate 1, the IC chip 9 for driving the thin film transistors (indicated by a mounting position of the IC chip in FIG. 2) is mounted by chip-on-glass (COG) mounting in a state that the IC chip 9 is electrically connected with the plurality of input lines 2. The connection pads 3a, 3b are arranged in a staggered manner to cope with the high-definition display.

The liquid crystal panel includes inter-pad short-circuiting lines which are electrically connected with the respective input lines 2 and pass below the IC chip 9, while short-circuiting lines which electrically connect the inter-pad short-circuiting lines with each other are arranged outside a region where the IC chip 9 is mounted and inside an end surface of the substrate 1. Cut portions of the plurality of inter-pad short-circuiting lines are arranged outside the connection pads and inside the short-circuiting lines. Particularly, a cut region where the electric connection between the plurality of inter-pad short-circuiting lines and the short-circuiting lines is cut is arranged outside the region where the IC chip is mounted and inside the short-circuiting lines.

Figure 3:
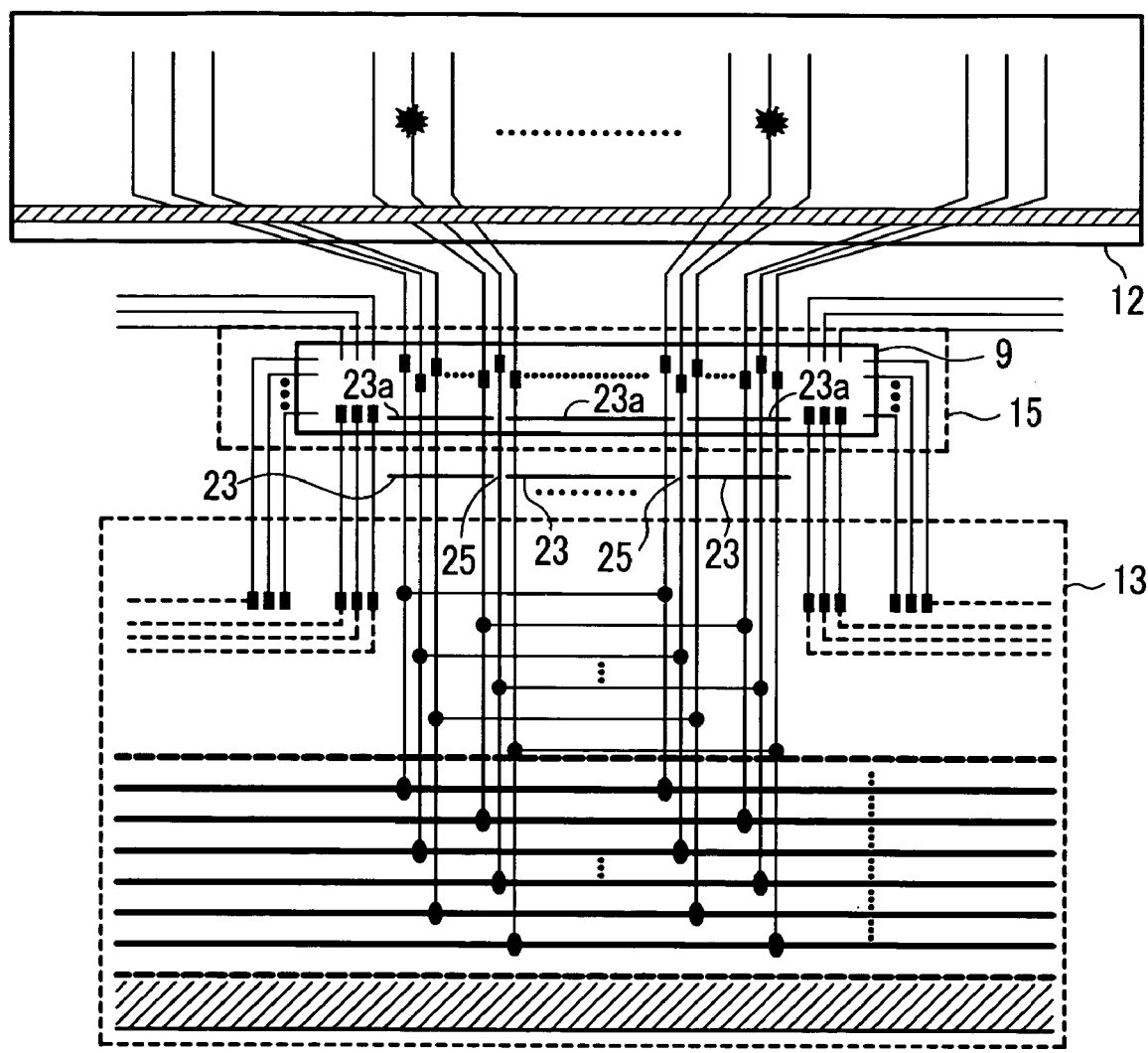
FIG. 3 is a plan view of an essential part showing a state in which the repair is conducted on the insulation substrate shown in FIG. 1 using a laser skipping technique, an IC chip and a flexible printed circuit board are mounted on the insulation substrate and a transparent insulation substrate which constitutes another substrate is laminated to the insulation substrate.

FIG. 3 is a plan view of an essential part showing a state in which the repair is conducted on the insulation substrate shown in FIG. 1 using a laser skipping technique, an IC chip and a flexible printed circuit board are mounted on the insulation substrate and a transparent insulation substrate which constitutes another substrate is laminated to the insulation substrate. Numeral 23 indicates a portion cut by laser beams and numeral 25 indicates portions which are not cut by skipping laser beams. Here, numeral 23a indicates cut portions below the IC chip. Alternatively, to surely cut the short-circuiting lines, the cut portions may be formed in plural numbers. For example, the cut portions may be two portions constituted of the cut portion 23 and the cut portion 23a.

Figure 4:
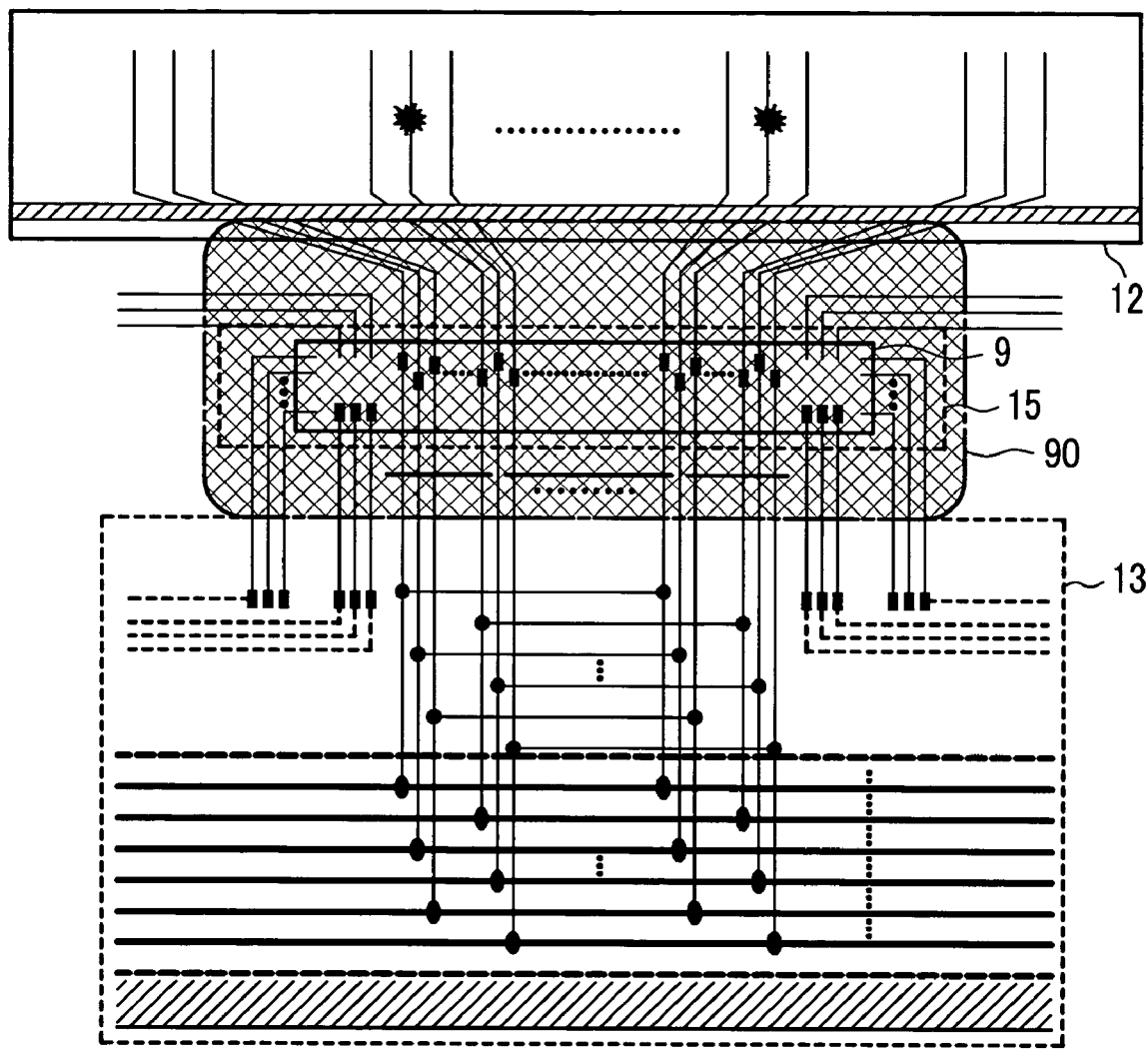
FIG. 4 is a plan view of an essential part similar to FIG. 2 or FIG. 3 showing a portion where resin is applied at the time of mounting an IC chip.

FIG. 4 is a plan view of an essential part similar to FIG. 2 or FIG. 3 showing a portion where resin is applied at the time of mounting an IC chip. In the drawing, a hatching applied portion indicated by numeral 90 indicates a resin applied portion.

Figure 5:
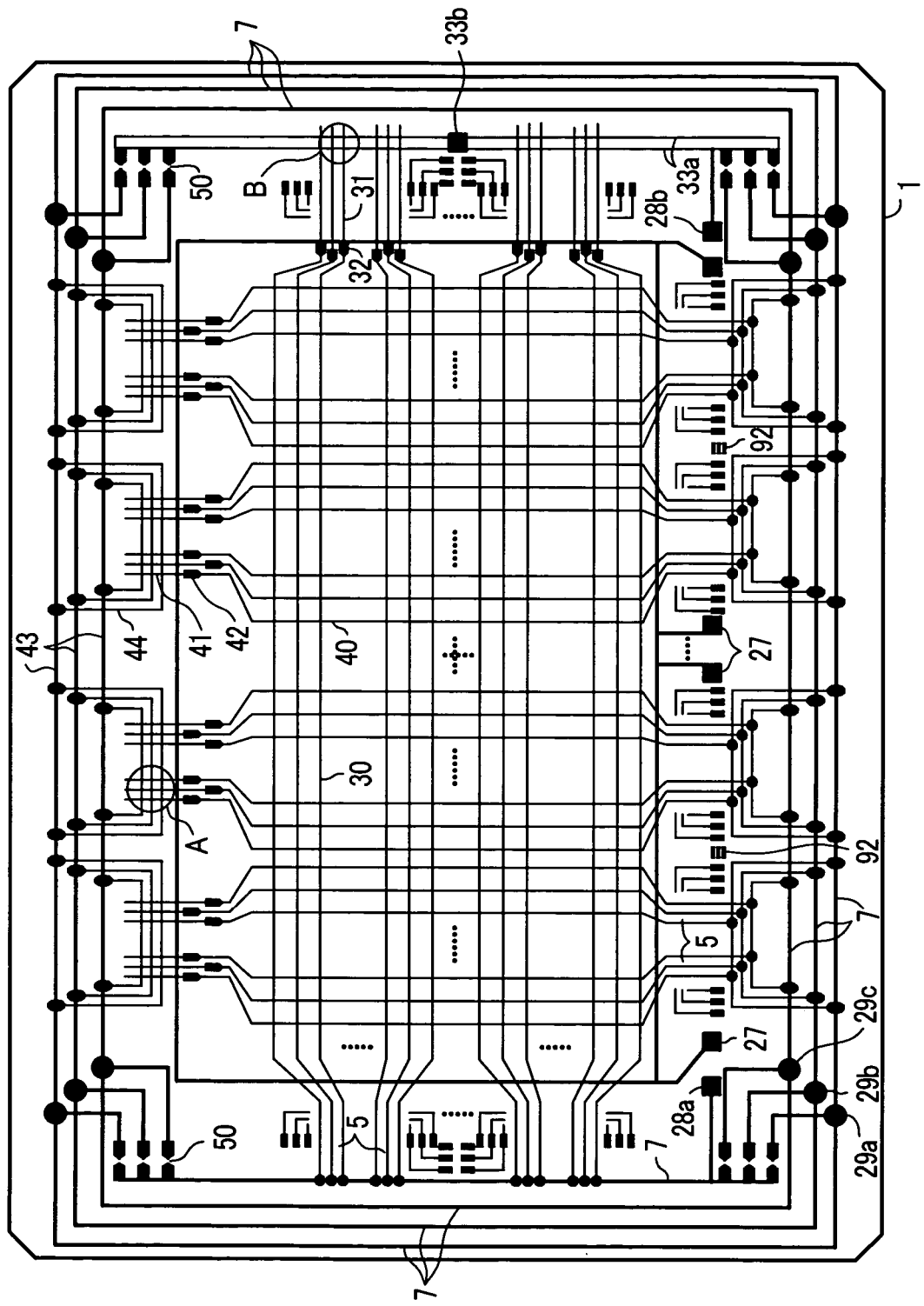
FIG. 5 is a plan view showing the whole TFT substrate of the embodiment 1.

FIG. 5 is a plan view showing the whole TFT substrate of the embodiment 1. In the drawing, numeral 27 indicates connection pads for common signal line (a turn-on inspection pad), numerals 28a, 28b indicate pseudo turn-on inspection pads on a gate-signal-line side, numerals 29a, 29b, 29c indicate pseudo turn-on inspection pads on a drain-signal-line side, numeral 30 indicates gate signal lines, numeral 31 indicates extension lines which are extended from the gate signal lines (here, formed on the same layer as the gate signal lines), numeral 32 indicates pads for disconnection/short-circuiting inspection of the gate signal lines, numeral 33 indicates gate-signal-line repair lines (here, formed on the same layer as the drain signal lines), numeral 40 indicates drain signal lines, numeral 41 indicates extension lines which are extended from the drain signal lines (here, formed on the same layer as the drain signal lines), numeral 42 indicates pads for disconnection/short-circuiting inspection of the drain signal lines, numeral 43 indicates drain-signal-line repair lines, numeral 44 indicates branched repair lines (here, for every R, G, B, formed on the same layer as the gate signal lines) which are branched from the drain-signal-line repair lines 43, numeral 50 indicates a pattern for coping with static electricity, and numeral 92 indicates a connection pattern between FPC lines.

In this embodiment, one pseudo turn-on inspection pad 28a is formed on the gate-signal-line side and an all-line simultaneous turn-on test is performed. However, gate-signal-line groups formed of even-numbered gate signal lines and odd-numbered gate signal lines may be connected to two short-circuiting lines and a gate ON pulse may be applied through two inspection pads 28a while offsetting the writing timing. In this turn-on testing method, in the same manner as the case in which neighboring pixels are operated by dot inversion driving which is usually used in the gate signal line extending direction, it is possible to apply the signal voltage having the inverse polarity with respect to the reference signal potential to the pixels through the drain signal lines and hence, it is possible to perform the detailed test such as flickering of a screen.

Figure 6A:
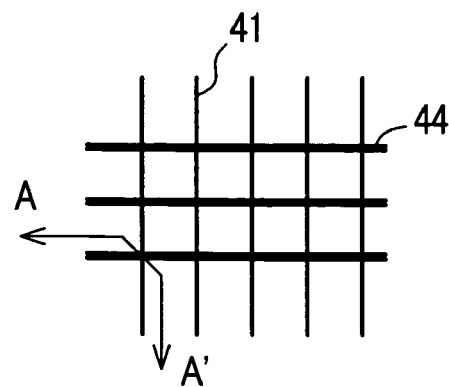
FIG. 6A and FIG. 6B are detailed explanatory views of a portion A in FIG. 5.
Figure 6B:
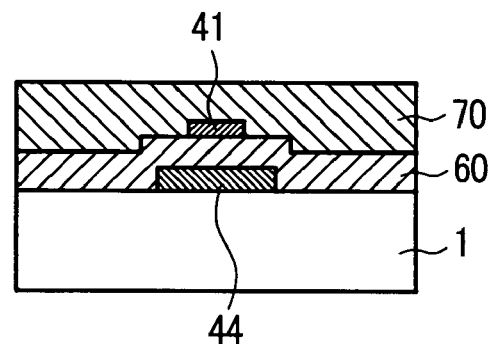
Figure 7A:
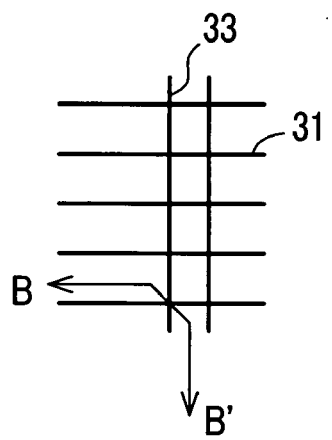
FIG. 7A and FIG. 7B are detailed explanatory view of a portion B in FIG. 5.
Figure 7B:
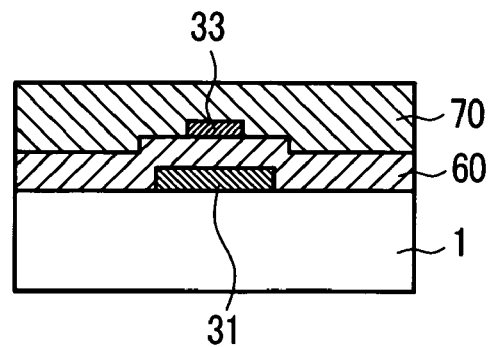

Here, FIG. 6A and FIG. 6B are detailed explanatory views of a portion A in FIG. 5, wherein FIG. 6A is a plan view of a portion A picked up from FIG. 5 and FIG. 6B is a cross-sectional view taken along a line A-A' in FIG. 6A. FIG. 7A and FIG. 7B are detailed explanatory views of a portion B in FIG. 5, wherein FIG. 7A is a plan view of a portion B picked up from FIG. 5 and FIG. 7B is a cross-sectional view taken along a line B-B' in FIG. 7A. In FIG. 6 and FIG. 7, numeral 60 indicates a gate insulation film and numeral 70 indicates a protective insulation film.

Figure 8:
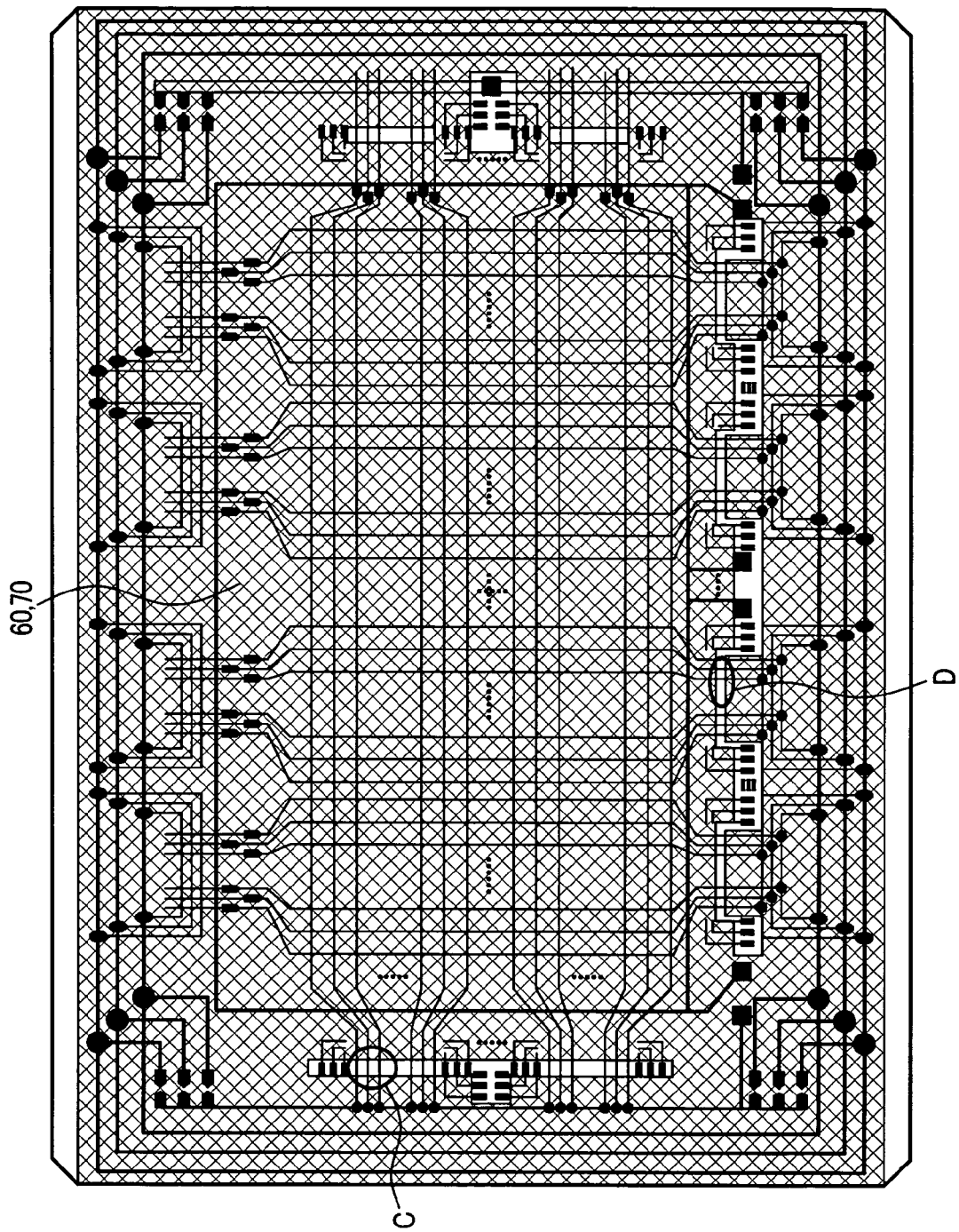
FIG. 8 is a plan view showing the whole TFT substrate of the embodiment 1 for explaining a region where a gate insulation film and a protective film are formed in FIG. 5.
Figure 9A:
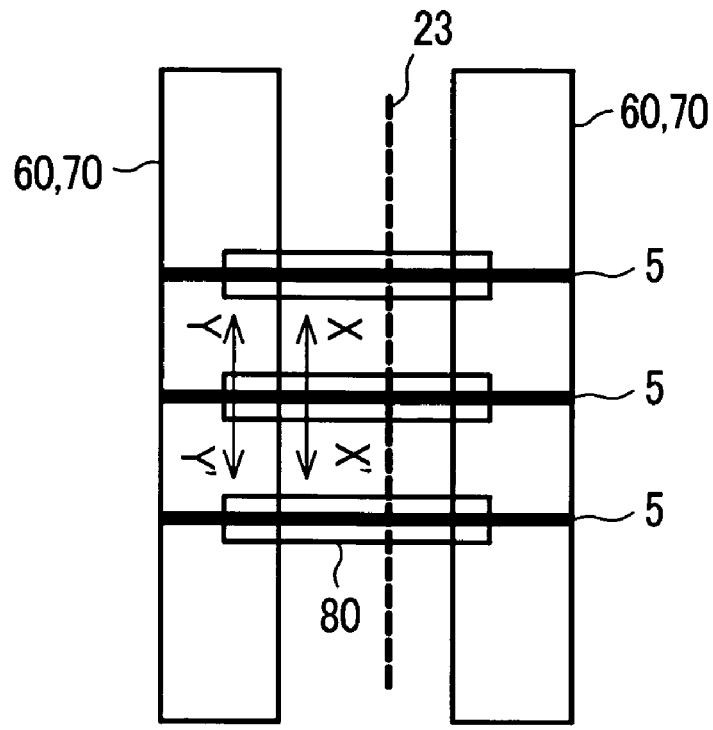
FIG. 9A, FIG. 9B, and FIG. 9C are detailed explanatory views of a portion C shown in FIG. 8.
Figure 9B:
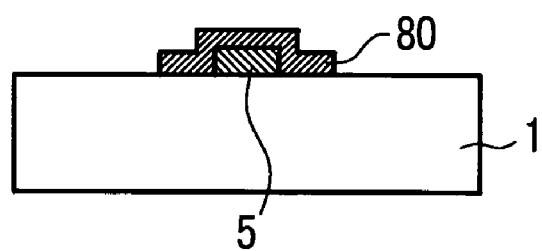
Figure 9C:
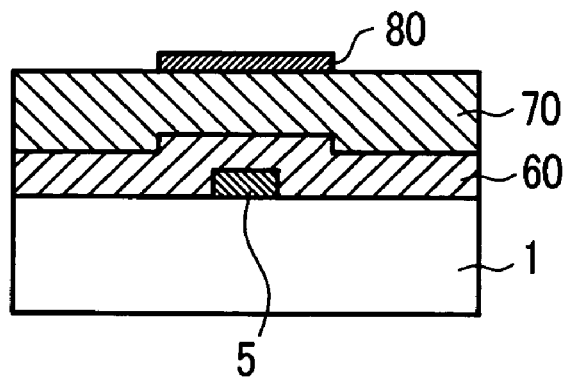
Figure 10A:
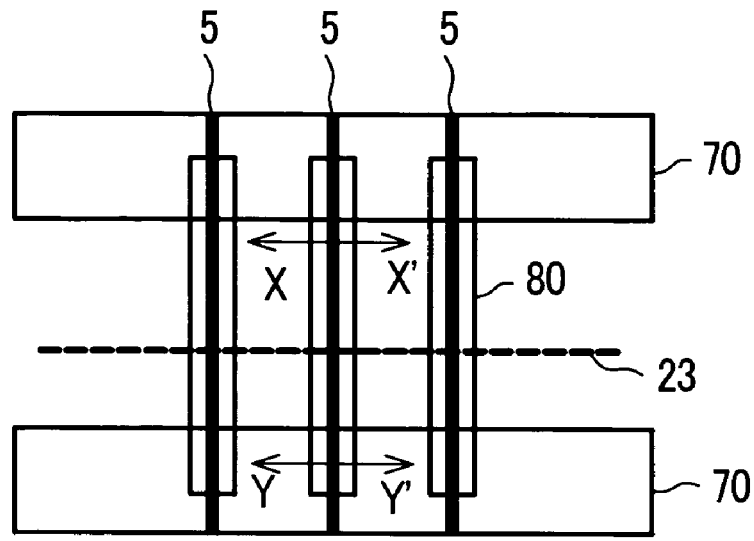
FIG. 10A, FIG. 10B, and FIG. 10C are detailed explanatory views of a portion D shown in FIG. 8.
Figure 10B:
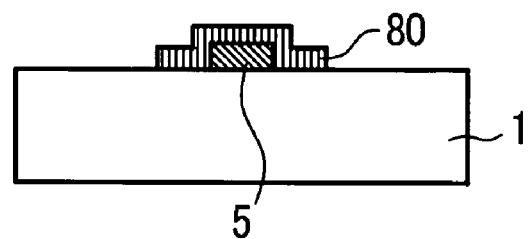
Figure 10C:
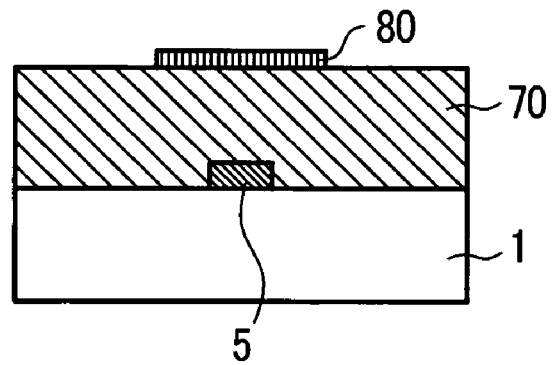

FIG. 8 is a plan view showing the whole TFT substrate of the embodiment 1 for explaining a region where the gate insulation film and the protective film shown in FIG. 5 are formed. Further, FIG. 9A to FIG. 9C are detailed explanatory views of a portion C shown in FIG. 8, wherein FIG. 9A is a plan view of the portion C picked up from FIG. 8, FIG. 9B is a cross-sectional view taken along a line X-X' in FIG. 8A, and FIG. 9C is a cross-sectional view taken along a line Y-Y' in FIG. 9A. Further, FIG. 10A to FIG. 10C are detailed explanatory views of a portion D shown in FIG. 8, wherein FIG. 10A is a plan view of the portion D picked up from FIG. 8, FIG. 10B is a cross-sectional view taken along a line X-X' in FIG. 10A, and FIG. 10C is a cross-sectional view taken along a line Y-Y' in FIG. 10A. In FIG. 9A to 9C and FIG. 10A to FIG. 10C, numeral 1 indicates a TFT substrate, numeral 5 indicates inter-pad short-circuiting lines, numeral 23 indicates a portion cut by laser beams, numeral 60 indicates a gate insulation film, numeral 70 indicates a protective insulation film, and numeral 80 indicates a transparent conductive film.

Figure 11:
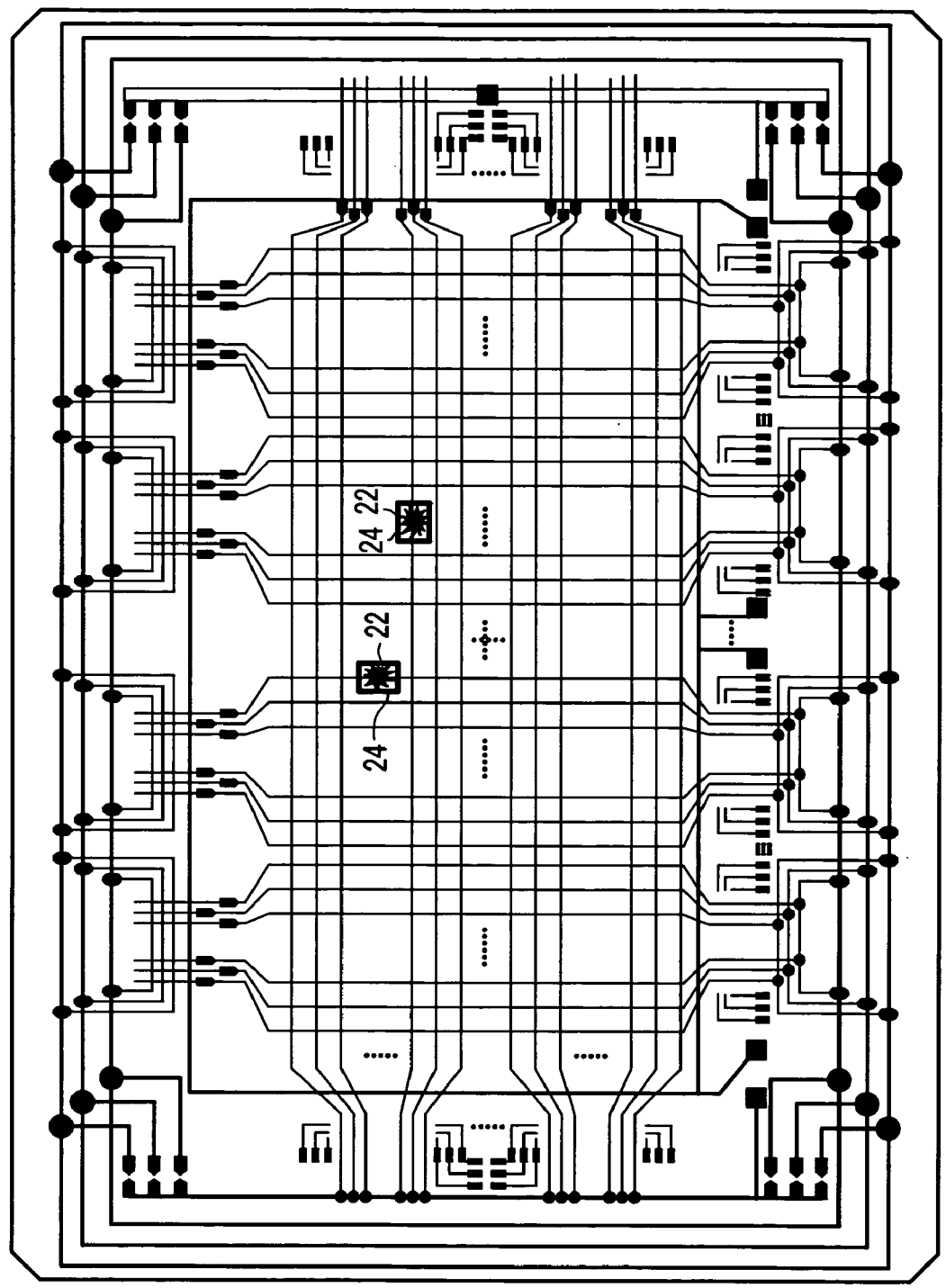
FIG. 11 is a plan view for explaining the disconnection defective portions and repaired portions using a metal complex in the TFT substrate shown in FIG. 5.
Figure 12:
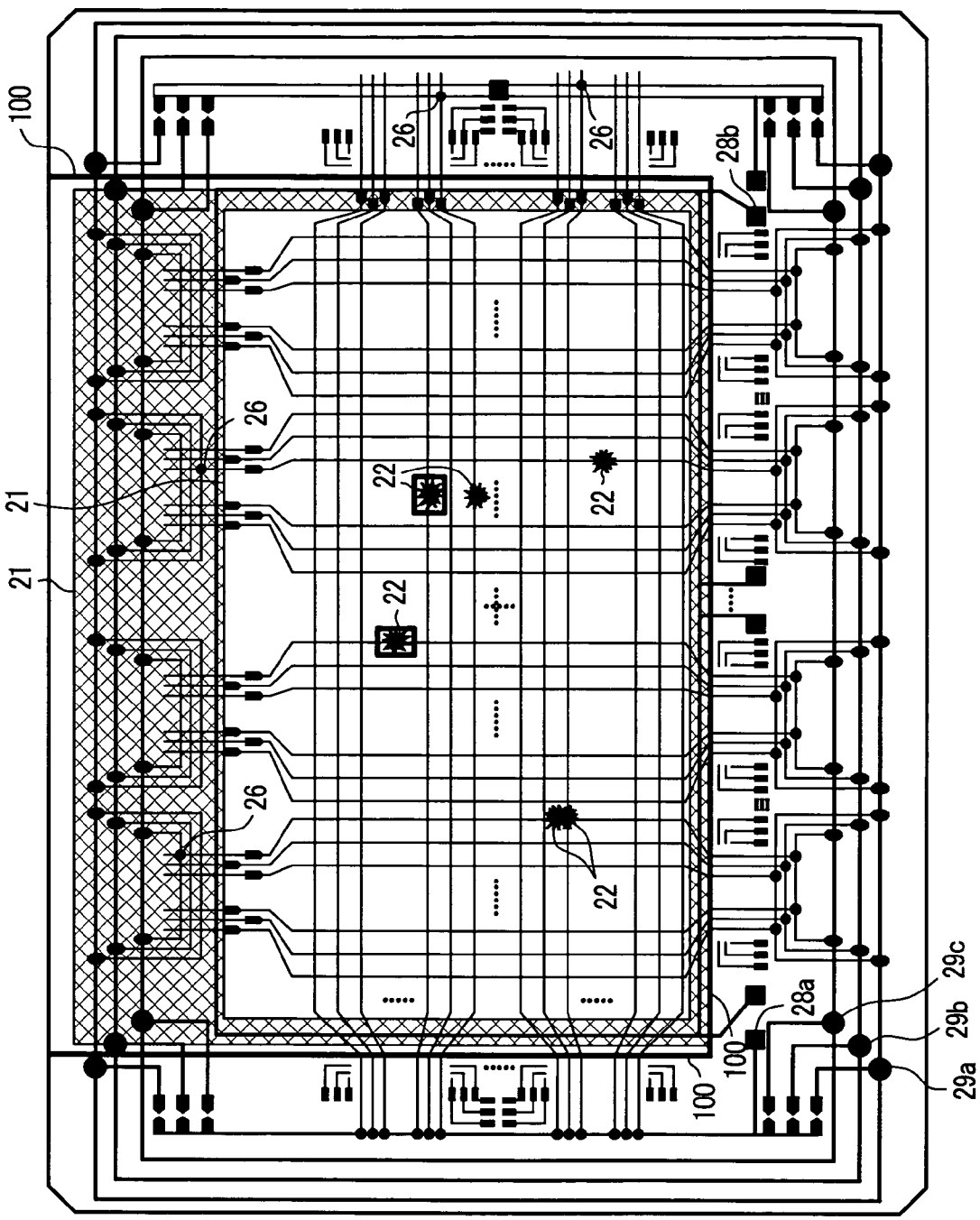
FIG. 12 is a plan view showing a state in which a transparent insulation substrate which constitutes another substrate is laminated to the TFT substrate shown in FIG. 5 together with cutting defective portions and portions where lines on different layer are electrically connected with each other using laser beams.

FIG. 11 is a plan view for explaining the disconnection defective portions 22 and repaired portions 24 using a metal complex in the TFT substrate shown in FIG. 5. Further, FIG. 12 is a plan view for explaining the cut defective portions and portions where lines in different layers are electrically connected using laser beams in the TFT substrate shown in FIG. 5. Numeral 26 indicates portions where lines in different layers are electrically connected using laser beams.

Figure 13:
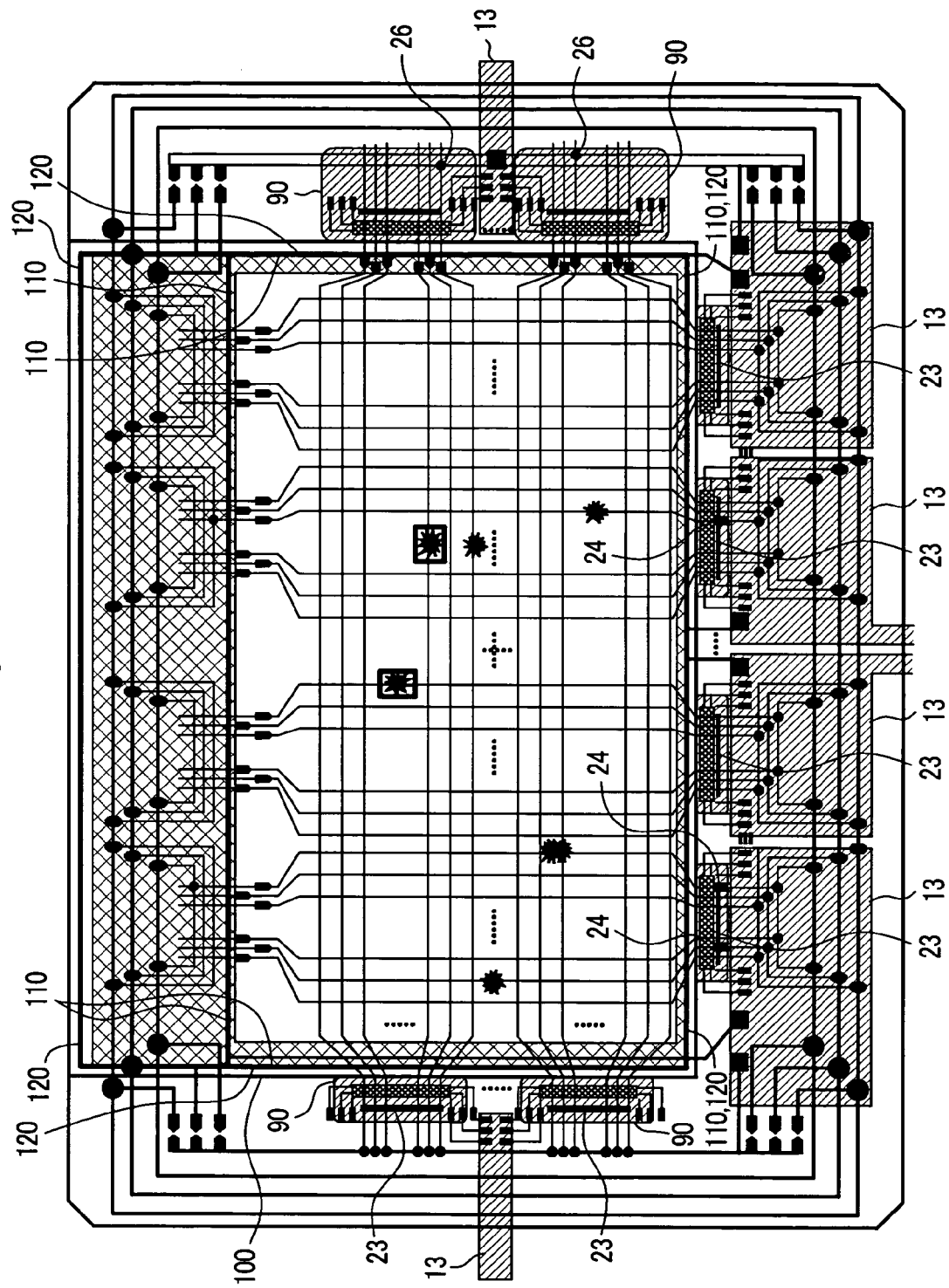
FIG. 13 is a plan view showing a state in which another substrate is laminated to the TFT substrate which is repaired by a metal complex together with portions which are covered with resin for a FPC, a polarizer and an IC chip of a gate.

FIG. 13 is a plan view showing a state in which another substrate is laminated to the TFT substrate which is repaired by a metal complex together with portions which are covered with resin for an IC chip of a FPC, polarizers and a gate. Numeral 13 indicates the FPC, numeral 90 indicates a resin applied portion, numeral 110 indicates the lower polarizer, and numeral 120 indicates the upper polarizer.

Figure 14:
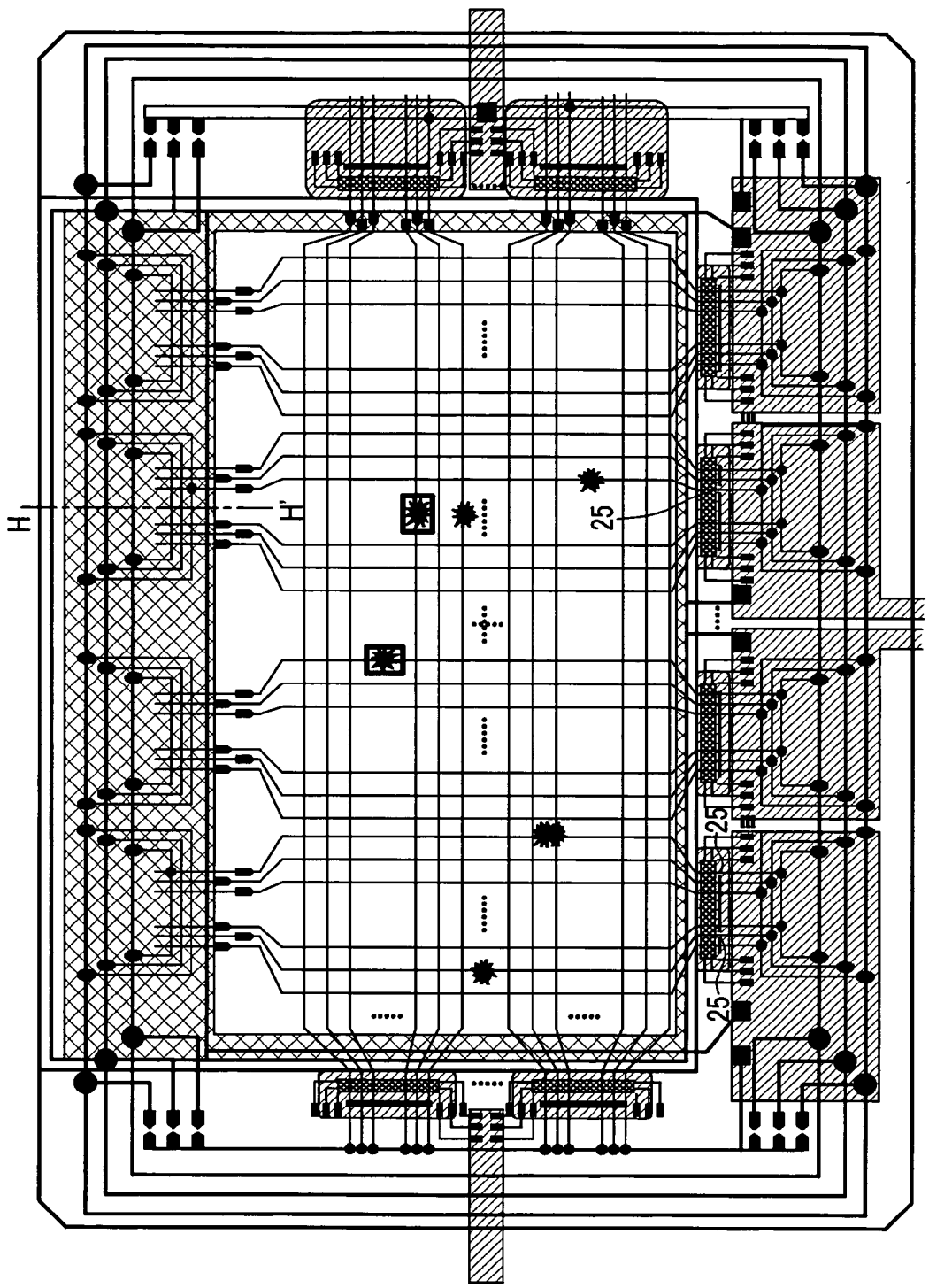
FIG. 14 is a plan view showing a state in which another substrate is laminated to the TFT substrate which is repaired by a laser skipping technique together with portions which are covered with resin for an IC chip of a FPC, a polarizer or a gate.

FIG. 14 is a plan view showing a state in which another substrate is laminated to the TFT substrate which is repaired by a laser skipping technique together with portions which are covered with resin for an IC chip of a FPC, a polarizer or a gate.

Figure 15:
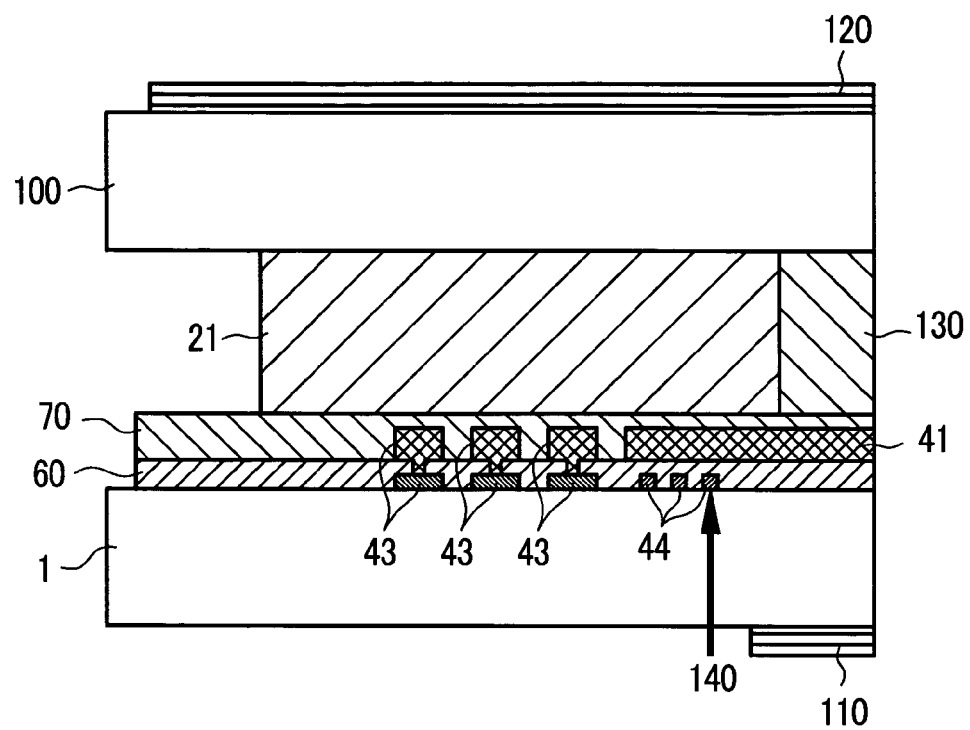
FIG. 15 is a cross-sectional view taken along a line H-H' in FIG. 14.

FIG. 15 is a cross-sectional view taken along a line H-H' in FIG. 14. Numeral 1 indicates a TFT substrate, numeral 100 indicates another substrate, numeral 21 indicates a sealing portion, numeral 130 indicates liquid crystal, and numeral 140 indicates laser beams. Here, numeral 41 indicates extension lines which are extended from drain lines, numeral 43 indicates drain-line repair lines, and numeral 44 indicates branched repair lines which are branched from the drain-line repair lines 43.

Figure 16:
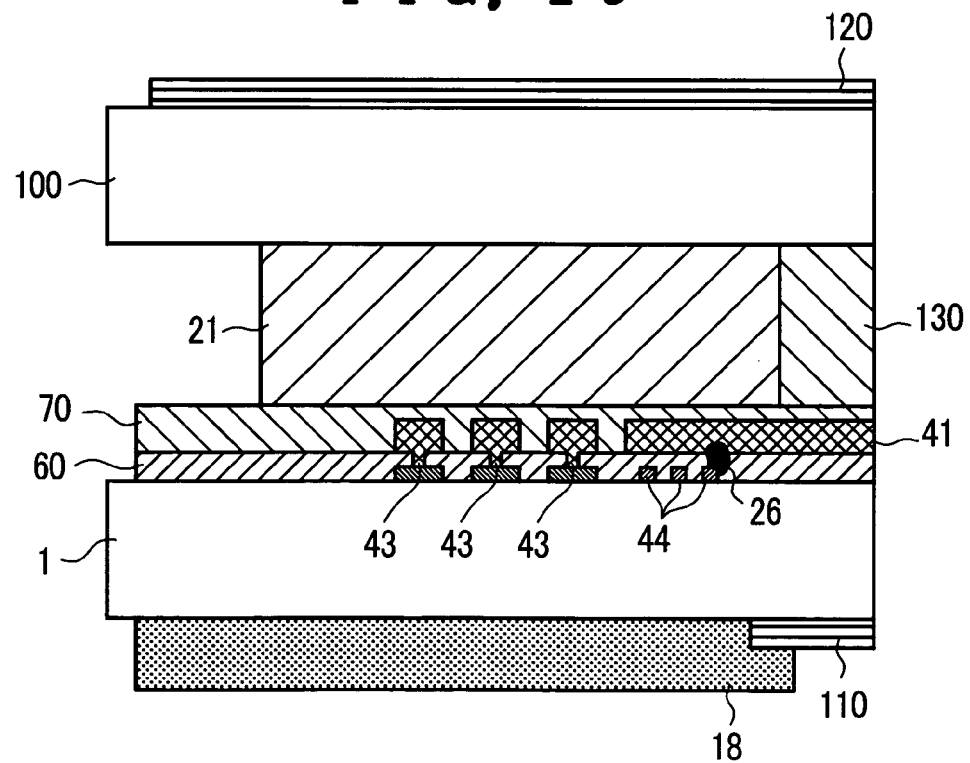
FIG. 16 is a cross-sectional view showing a state in which an extension line extended from the drain line and a branched repair line which are lines arranged on different layers, as shown in FIG. 15 are electrically connected with each other by laser beams.

FIG. 16 is a cross-sectional view showing a state in which the extension lines extended from the drain lines and the branched repair lines which constitute lines formed on different layers as shown in FIG. 15 are electrically connected with each other by laser beams. Here, numeral 18 indicates a light blocking tape. FIG. 16 shows the state in which the branched repaired lines 44 which are branched from the drain-line repaired lines are connected to the extension lines 41 which are extended from the drain lines using laser beams.

Next, the manufacturing steps of the active matrix type liquid crystal display device of the embodiment 1 of the invention are explained in conjunction with FIG. 1 to FIG. 16.

1. TFT Substrate Film Forming Step

In this step, the gate/drain signal lines (material Mo/Al/Mo, Ti/Al/Ti or the like), the TFTs, the pixel electrodes and the like are formed. Here, the TFTs are formed of an amorphous silicon (a-Si) TFT. As shown in FIG. 8, parts except for the terminal portions, the cut regions, the common signal connection pads, the inspection pads are mainly covered with the gate insulation film and the PAS film.

2. Short-Circuiting and Disconnection Inspection Step (see FIG. 11)

In this step, a resistance value of a path between the pseudo turn-on inspection pad 28a on the gate signal line side and the disconnection and short-circuiting inspection pad 32 of the gate signal line is measured using an inspection probe. Further, a resistance value of a path between the pseudo turn-on inspection pads 29a, 29b, 29c on the drain signal line side and the disconnection and short-circuiting inspection pad 42 of the drain signal line is measured using an inspection probe.

3. Repair Step (Radiation of Laser Beams and Use to Metal Complex)

In this step, using a correction method described in Japanese Patent No. 3414024 and the like, the cut defective portions 22 are connected with a metal complex. That is, when the portion where the disconnection defect occurs can be specified, a distal end portion of a micro pipette is brought into contact with the line disconnected portion and a palladium complex solution is discharged and supplied from a distal end of the pipette. Thereafter, Ar laser beams which are grown to a size larger than at least a supply width of the palladium complex solution are radiated to the line and the disconnected line end portions and the palladium complex solution in the vicinity thereof are heated.

Here, an organic solvent of the palladium complex solution is evaporated and a palladium film is precipitated in the vicinity of the disconnected line end portions so that the favorable connection between the disconnected line end portions and the precipitated palladium film is established. Thereafter, while spraying an inactive gas such as nitrogen or the like to the line connection portion using a nozzle not shown in the drawing, the Ar laser beams are again radiated to the palladium film to perform annealing. Further, in the manner of radiating laser beams, the scanning is started from one side of the precipitated palladium film and, thereafter, the laser beams are sequentially radiated to the whole precipitated film and, as a result, the disconnected portions can be favorably electrically connected with the connection resistance of 100 to 200 Ω.

4. LCD Panel Step

In the LCD panel step, an orientation film is applied to a main surface of the TFT substrate and the rubbing treatment is applied to the orientation film so as to impart an orientation control function to the orientation film. A color filter substrate (a CF substrate set) which constitutes another substrate is laminated and assembled to the TFT substrate while interposing a sealing agent therebetween.

5. Liquid Crystal Filling and Sealing Step

In this step, the laminated substrates are cut along scribe lines.

6. Intermediate Pseudo Turn-On Inspection (Turn on to R, G, B Using the Turn-On Inspection Pads) Step (See FIG. 12)

In this step, a high (HIGH) level signal is inputted to the pseudo turn-on inspection pads 28a on the gate signal line side to turn on all TFTs on the display region, a given signal is inputted to the common signal connection pad, and ON signals for respective colors RGB are inputted to the turn-on inspection pads 29a, 29b, 29c thus performing the RGB color or white-color turn-on inspection for detecting the specific signal lines which include defective portions.

In the embodiment 1, since new defects are found in two gate signal lines and two drain signal lines, the repair becomes necessary. The portions 26 where the lines on different layers are electrically connected each other are formed by radiating laser beams so as to allow the supply of the signals to the specified signal lines from both sides. The pseudo turn-on inspection is performed again to check whether the repair is successfully conducted and, thereafter, the operation advances to the next step. Here, in the above-mentioned test which is conducted again on the gate signal line side, after repairing, the ON signal is supplied also from the turn-on inspection pad 28b.

7. MD Step

Upper and Lower Polarizer Lamination Step 7-1 Repair Using a First Method (See FIG. 13)

The inter-pad short-circuiting lines and the short-circuiting lines are cut using laser beams. Here, for shortening the laser cut time, in this embodiment, the connection pads provided for connection with the IC chip are arranged in a staggered manner so that a total end-to-end width of a plurality of inter-pad short-circuiting lines is not so elongated. Further, in this embodiment, the respective gate signal line sides adopt a method which drives the vertical scanning circuit from both sides and hence, it is unnecessary to use the repair lines 33a. However, it is possible to supply repair signals to portions 33b of the repair lines from the gate-side FPC 13.

Thereafter, the ACF lamination, the COG mounting of the IC chip and the FPC lamination are performed and, thereafter, the final turn-on inspection (operation of the IC chip) is performed. A metal complex is used in the repair step (see FIG. 2). Thereafter, the resin coating is performed.

7-2 Repair Using a Second Method (See FIG. 14)

First of all, the ACF lamination, the COG mounting of the IC chip and the FPC lamination are performed and, thereafter, the pseudo turn-on inspection (turn on to R, G and B by operating the IC chip) is performed.

In the repair step adopting the second method (using the laser radiation skipping method shown in FIG. 3), the inter-pad short-circuiting lines which are electrically connected with the signal lines which require the repair are not cut. Thereafter, the resin coating is performed and the final turn-on inspection (confirmation of the operation of the IC chip) is performed.

According to the embodiment 1, since the repair lines on the IC mounting side do not cross the signal lead lines, the crossing capacitance is reduced whereby the signal delay of the repair lines is decreased. Further, a large number of repair lines can be formed and, at the same time, the short-circuiting lines remain on the substrate and hence, the defects attributed to stress generated by the static electricity can be reduced. Further, since the number of substrate cut portions is decreased, the defects attributed to the mechanical stress generated by damages on the terminal portions are reduced whereby a waste glass amount is also largely reduced. Here, also with respect to the bendable substrate such as a substrate which forms an insulation film on a plastic (PES (Polyethersulfone)) film, steel foil or the like, the reduction of the number of substrate cutting times is effective to reduce the defects.

Embodiment 2

Figure 17:
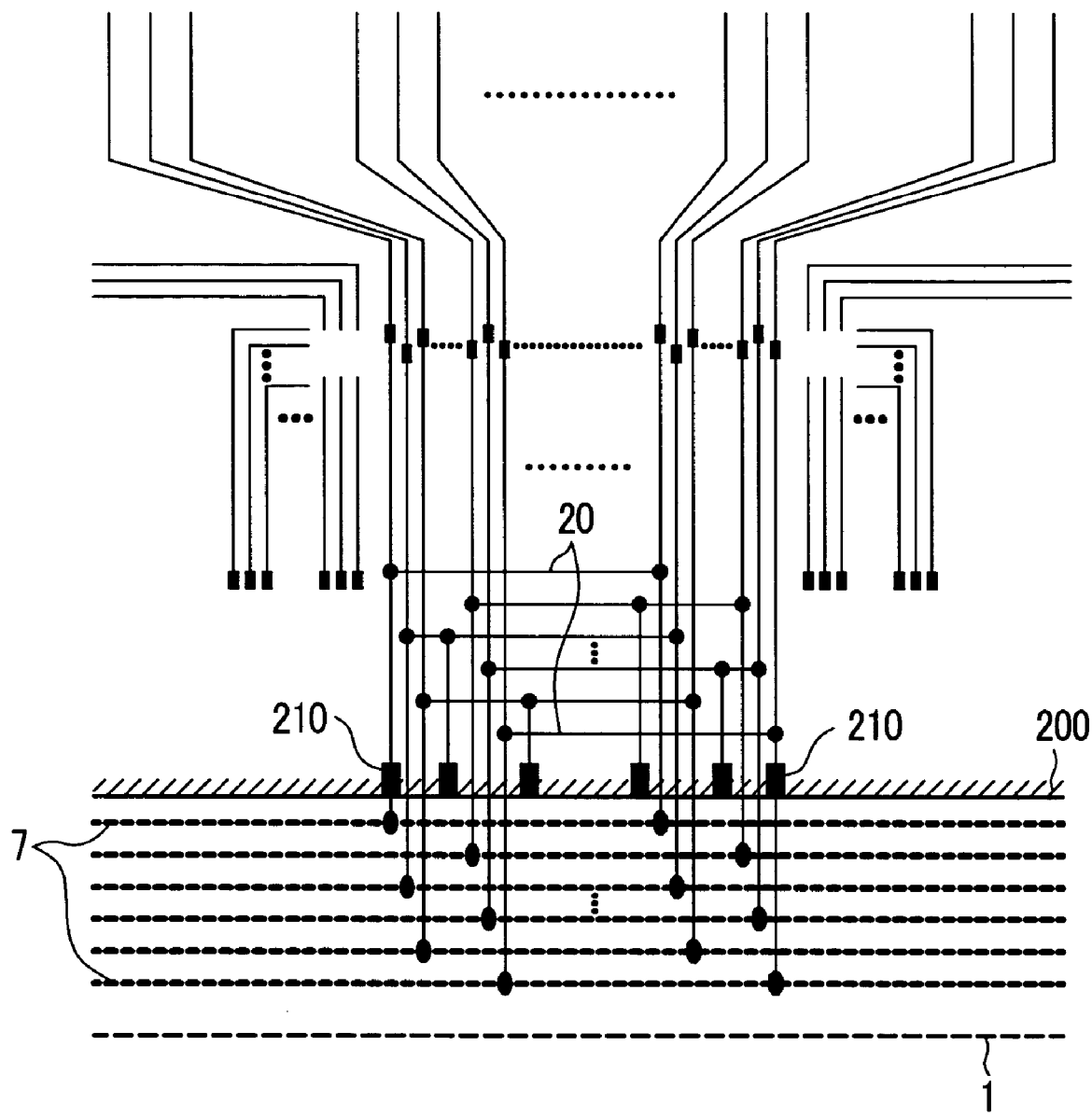
FIG. 17 is a plan view of an essential part similar to FIG. 1 for explaining an embodiment 2 of the present invention.
Figure 18:
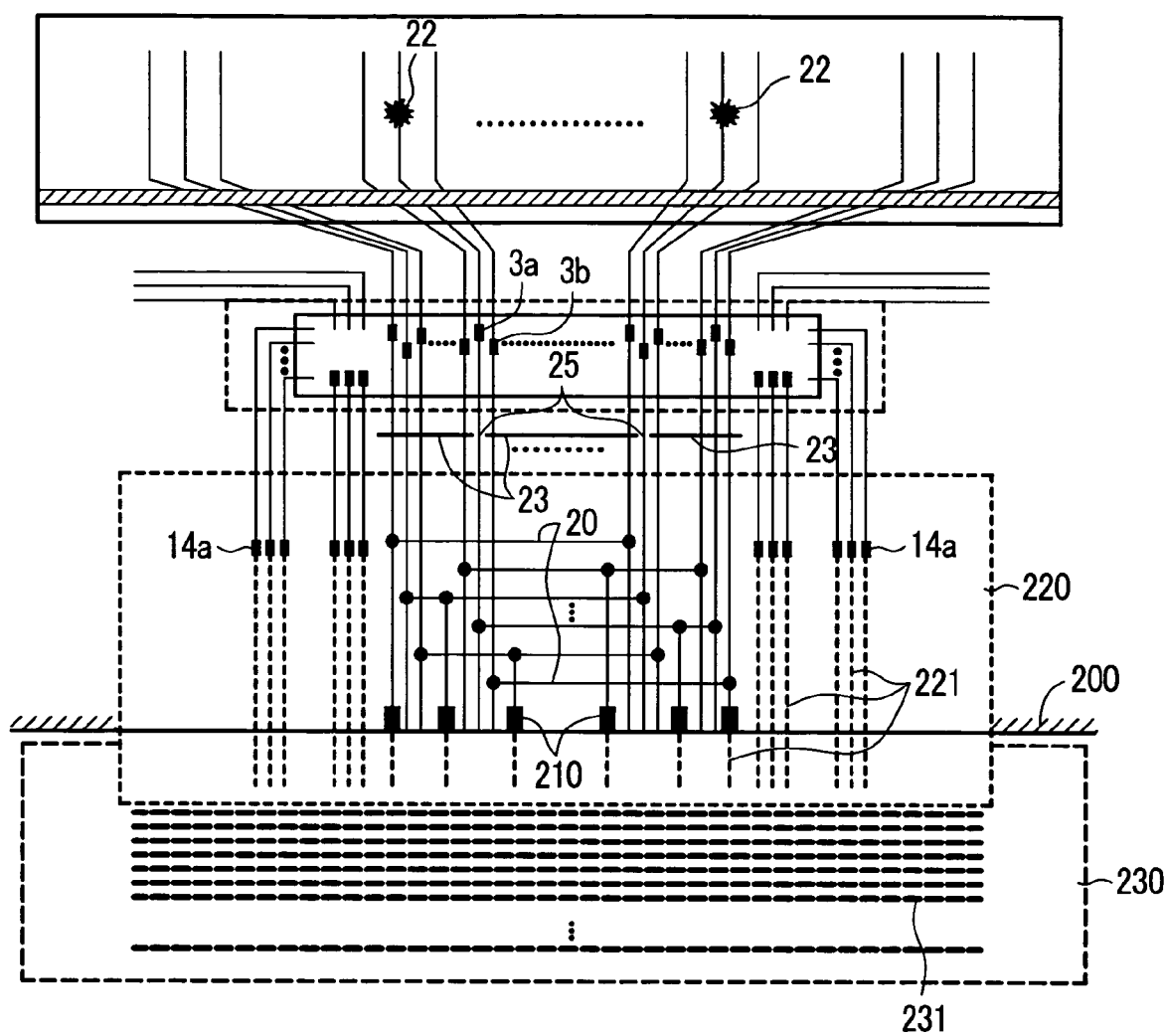
FIG. 18 is a plan view of an essential part similar to FIG. 2 for explaining an embodiment 2 of the present invention.
Figure 19:
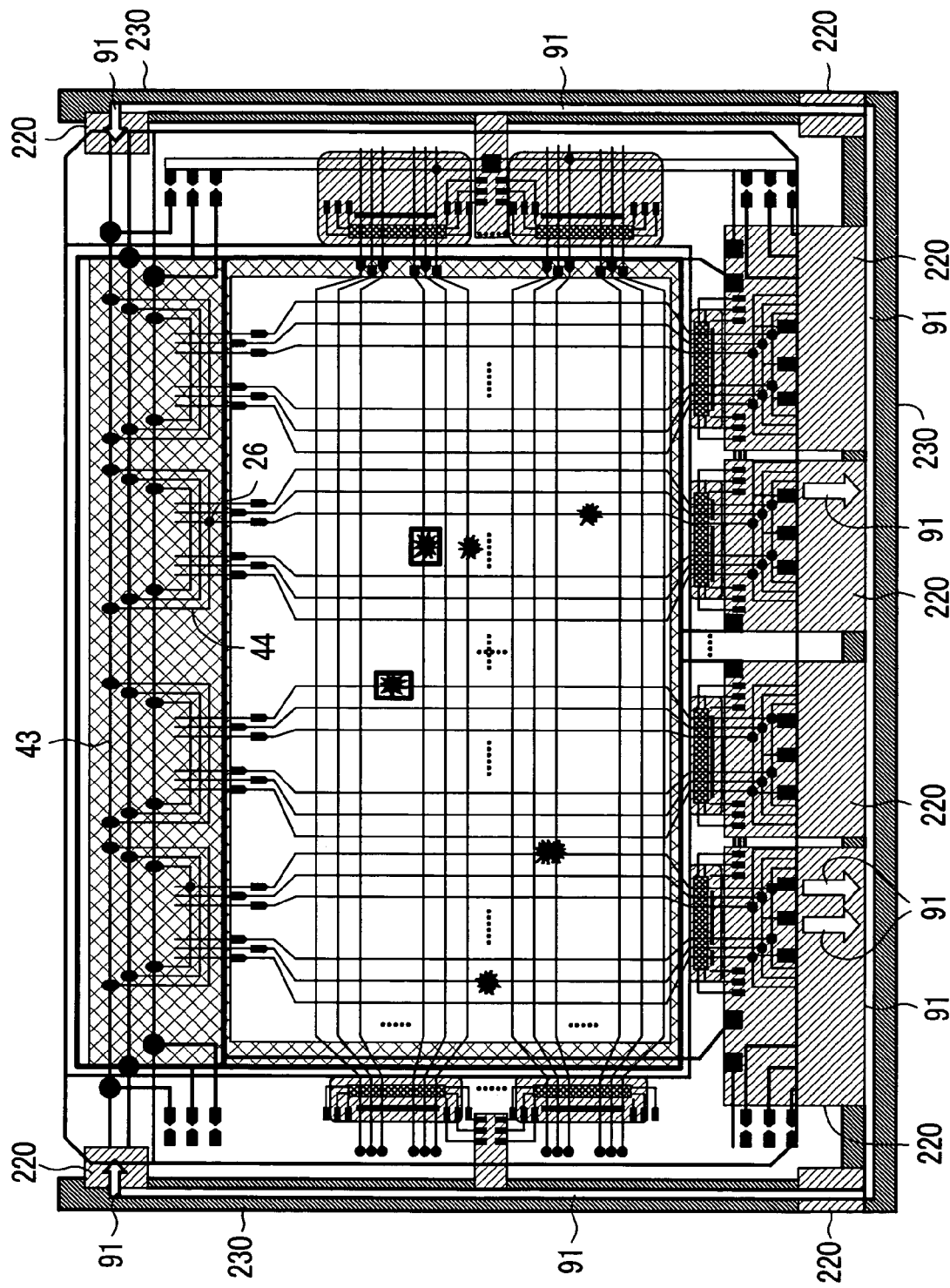
FIG. 19 is a plan view of an essential part similar to FIG. 13 for explaining an embodiment 2 of the present invention.

The embodiment 2 of the present invention is explained in conjunction with FIG. 17 to FIG. 19. FIG. 17 is a plan view of an essential part similar to FIG. 1 for explaining the embodiment 2 of the present invention. In FIG. 17, numeral 200 indicates an end surface of a substrate after cutting the substrate and numeral 210 indicates connection terminal portions with FPC lines, wherein numerals which are equal to the numerals in FIG. 1 indicate identical functional parts. FIG. 18 is a plan view of an essential part similar to FIG. 2 for explaining the embodiment 2 of the present invention. In FIG. 18, numeral 14a indicates connection portions. Further, in FIG. 18, numeral 220 indicates an FPC, numeral 221 indicates lines in the inside of the FPC, numeral 230 indicates a printed circuit board, and numeral 231 indicates lines inside the printed circuit board. FIG. 19 is a plan view of an essential part similar to FIG. 13 for explaining an embodiment 2 of the present invention. In FIG. 19, numeral 91 indicates a signal supply path after repairing.

In FIG. 17, the short-circuiting lines 7 for static electricity are cut and are removed from the substrate. Branched short-circuiting lines 20 are left on the substrate thus forming the connection terminal portions 210 with the FPC lines. In FIG. 18, by electric connecting these terminal portions and the connection portions 14a with the lines 221 in the inside of the FPC board, the electric connection with the lines 231 on the printed circuit board 230 is established.

In FIG. 19, with respect to the signal supply path 91 to the specific signal lines to be repaired, the signals are guided to the connection pads 3a, 3b with the drive IC, the short-circuiting lines 25 which are not cut, the branched short-circuiting lines 20, the connection terminal portions 210 with the FPC lines, the lines 221 in the inside of the FPC and the lines 231 on the printed circuit board 230 thus turning around the peripheral circuit board and, thereafter, the signals are supplied to the signal lines above disconnection defective portions via repair lines 43, 44 and portions 26 connected by laser beams.

Also in the embodiment 2, since the repair lines on the IC mounting side do not cross the signal lead lines, the crossing capacitance is reduced whereby the signal delay of the repair lines is decreased. Further, a large number of repair lines can be formed and, at the same time, the short-circuiting lines remain on the substrate and hence, the defects attributed to stress generated by the static electricity can be reduced. Further, since the number of substrate cut portions is decreased, the defects attributed to the mechanical stress generated by damages on the terminal portions are reduced whereby a waste glass amount is also largely reduced.

Embodiment 3

Figure 20:
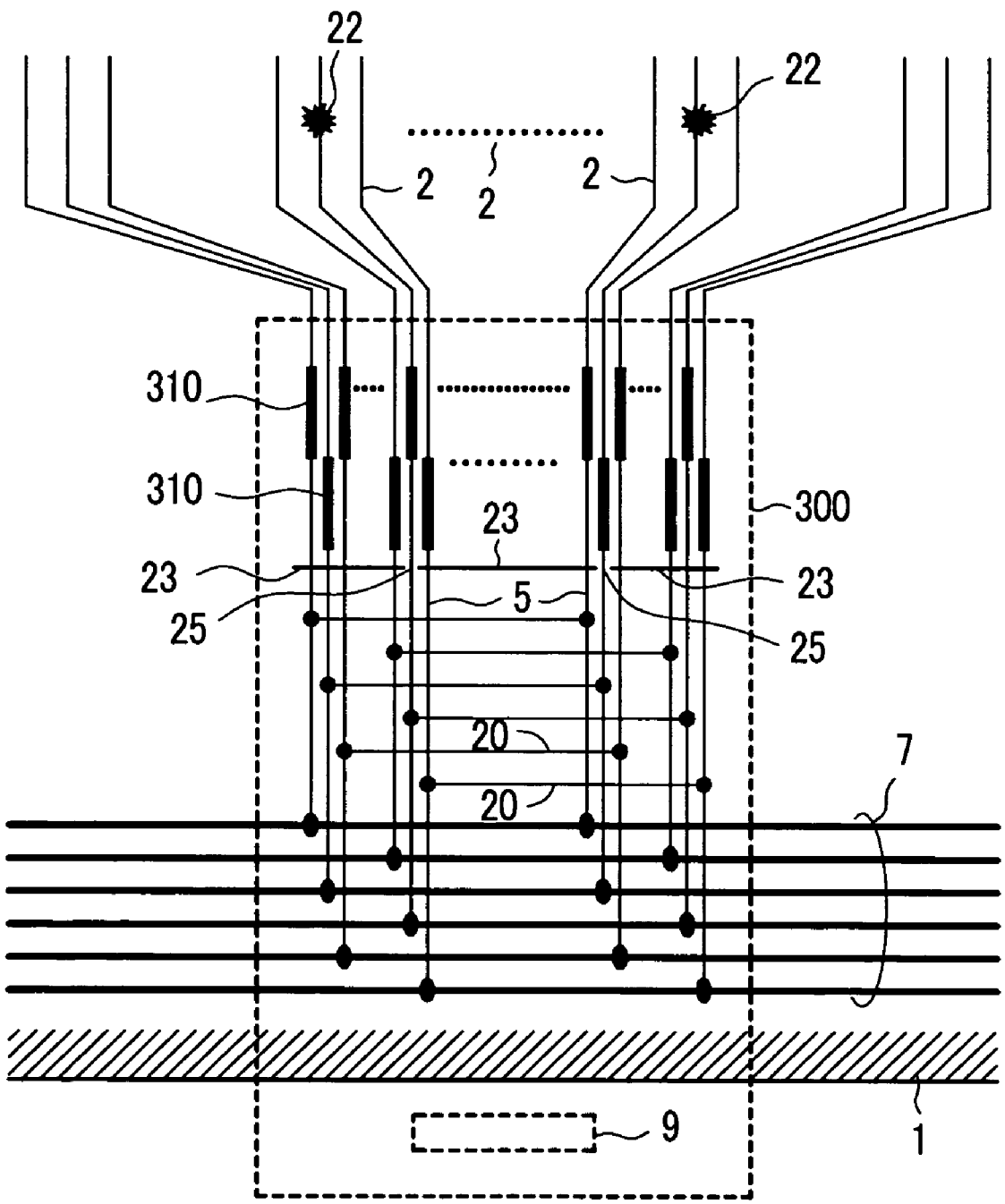
FIG. 20 is a plan view of an essential part similar to FIG. 1 for explaining an embodiment 3 of the present invention.
Figure 21:
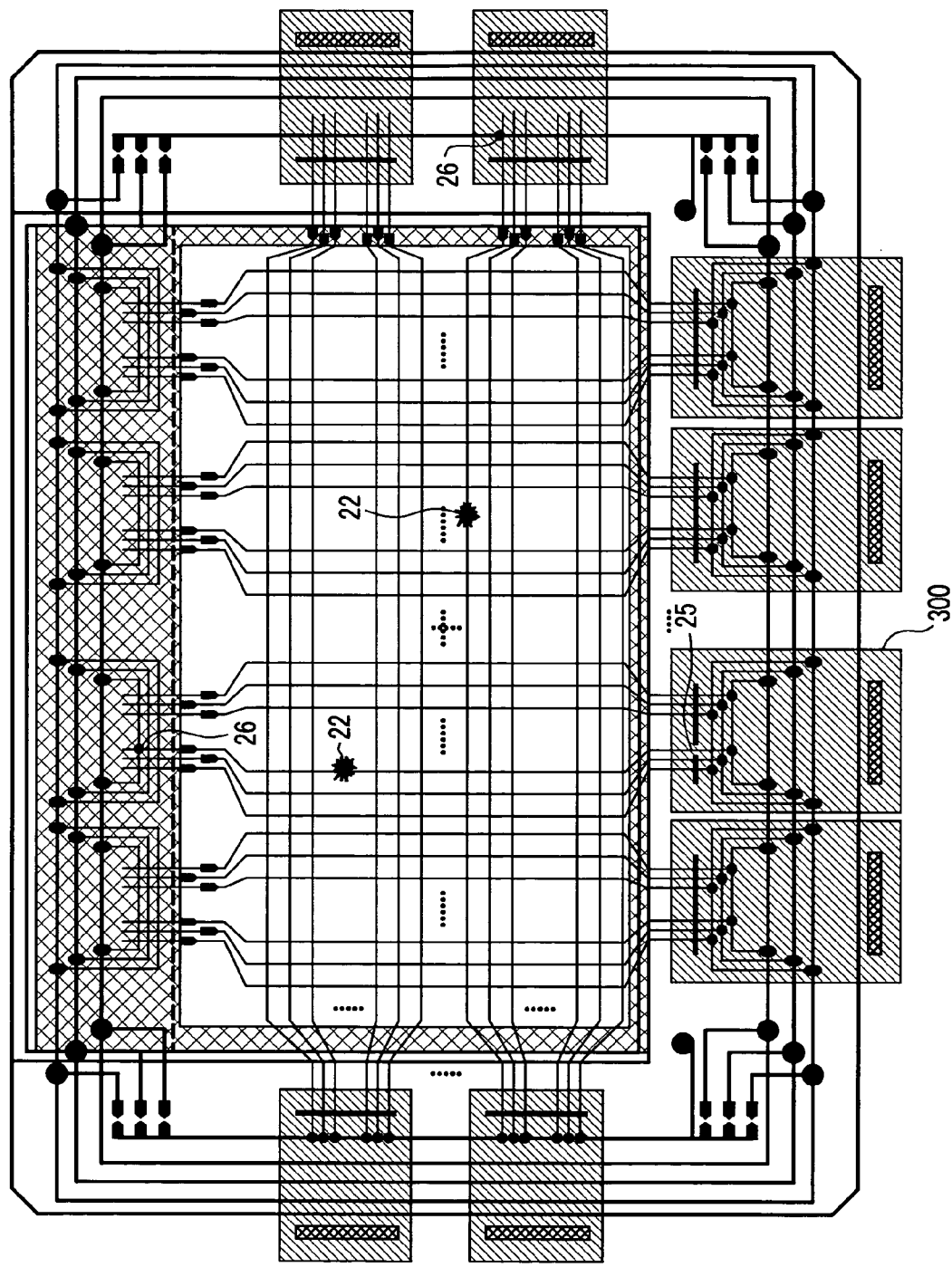
FIG. 21 is a plan view of an essential part similar to FIG. 13 for explaining an embodiment 3 of the present invention.

The embodiment 3 of the present invention is explained in conjunction with FIG. 20 and FIG. 21. FIG. 20 is a plan view of an essential part similar to FIG. 1 for explaining the embodiment 3 of the present invention. In FIG. 20, numeral 300 indicates a tape carrier package (TCP) and numeral 310 indicates connection terminal portions with FPC lines, wherein numerals which are equal to the numerals in FIG. 1 and FIG. 17 indicate identical functional parts. FIG. 21 is a plan view of an essential part similar to FIG. 13 for explaining the embodiment 3 of the present invention. In FIG. 21, numeral 26 indicates portions where the lines on different layers are electrically connected with each other using laser beams.

For shortening the laser cut time, in this embodiment, the connection terminal portions provided for connection with the TCP are arranged in a staggered manner so that a total end-to-end width of a plurality of inter-pad short-circuiting lines is not so elongated (FIG. 20). As shown in FIG. 21, in this embodiment, the TCP is used thus enabling the repair while leaving the short-circuiting lines on the substrate.

Embodiment 4

In FIG. 5, there is illustrated the example showing a case in which four gate-side driving IC chips in total and four drain-side driving IC chips in total are mounted. However, even when the number of pixels is increased, the present invention is applicable in the same manner. For example, in an example of a panel for HDTV (high definition television) of a nominal 40 inches size, the number of gate lines is 1080 and the number of drain lines is 1920×3 (R, G, B) in the display region. Further, signal-line resistance values become rather high such that a gate-signal-line resistance value is approximately 5 kΩ and a drain-signal-line resistance value is approximately 20 kΩ. For example, assuming the number of outputs of the gate-side driving IC as 270, for performing the both-side driving, 8 gate-side driving IC chips in total become necessary. Further, assuming the number of outputs of the drain-side driving IC chips as 480, 12 drain-side driving IC chips in total become necessary. In this case, to maintain the normal display after repairing by reducing the signal delay in the repaired path, it is necessary to minimize the wiring resistance and the crossing capacitance.

For example, assuming a line width of the short-circuiting lines 7 for static electricity and the repair lines 43 to 150 μm, each line interval to 75 μm and the number of repairable lines to 6 lines for each color of R, G and B, a width of the region for total 18 lines becomes approximately 4 mm. Here, the resistance values of turn-around paths from the inter-pad short circuiting lines which are connected with the specific signal lines having the disconnection to the extension lines 41 which are connected with the short-circuiting lines 7 for static electricity, the repair lines 43 and the specific signal line can be made, since these lines are arranged in parallel along the vertical scanning circuits arranged on both sides in this embodiment, approximately 1.0 kΩ or less per each path. Here, as shown in FIG. 16, the short-circuiting lines 7 for static electricity and repair lines 43 electrically connect the different conductive layers such as the gate layers, the drain layers, the pixel electrode layers and the like with each other via through holes thus reducing the resistance values as much as possible. With respect to the crossing capacitance, as shown in FIG. 5 and FIG. 6, the branched repair line crosses the maximum (the output number of the driving IC-1) extension line and forms the crossing capacitance. However, since the branched short-circuiting lines do not cross the input lines of the signal lines, it is possible to ignore the crossing capacitance and, as a result, the crossing capacitance can be reduced as a whole. With the provision of the above-mentioned repair path, the signal delay can be ignored thus realizing the reliable repair.

The FPC is electrically connected with the input line 6a to the driving IC chip using an anisotropic conductive film. Further, the FPC is laminated to the substrate such that the FPC covers the short-circuiting lines for static electricity or the branched short-circuiting lines on the peripheral portion of the substrate thus realizing the light-weighted and compact mounting.

Embodiment 5

Figure 26:
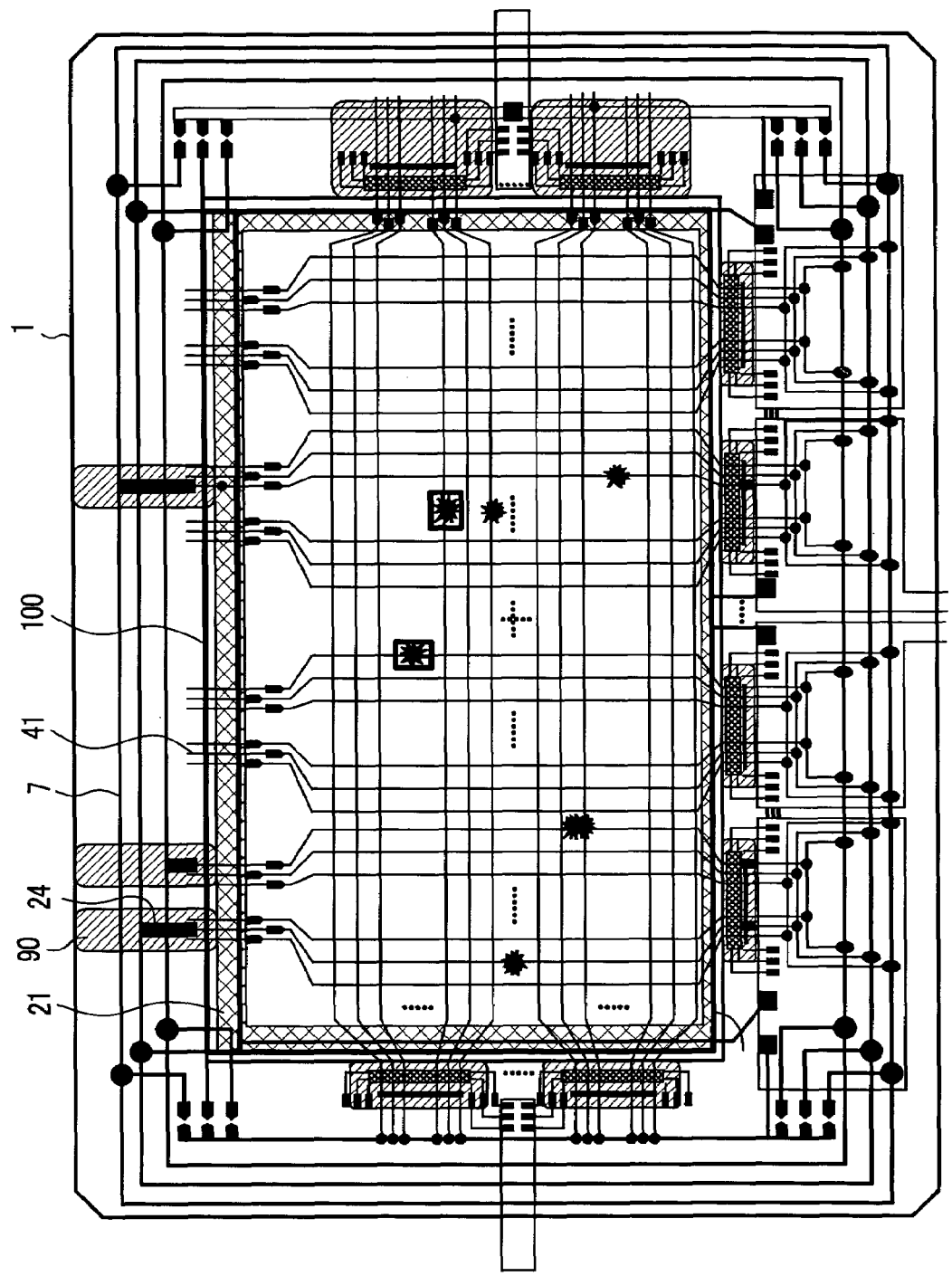
FIG. 26 is a plan view similar to FIG. 13 for explaining an embodiment 5 of the present invention.

FIG. 26 is a plan view similar to FIG. 13 for explaining the embodiment 5 of the present invention. In this embodiment, to reduce the crossing capacitance, as shown in an upper side of FIG. 26, the short-circuiting lines 7 for static electricity and the extension lines 41 which are connected with the signal lines are formed outside the sealing portion, while the specific signal lines are electrically connected with the short-circuiting lines 7 for static electricity using a metal complex (numeral 24). Here, the formation of through hole is performed such that an insulation film over respective lines 7 is removed by radiating the laser beams and, thereafter, surfaces of the respective lines are exposed and are connected with each other using the metal complex. Alternatively, it may be possible to adopt a method in which the above-mentioned lines is temporarily disconnected by radiating laser beams and, thereafter, the cross sections and the surfaces of the lines are exposed and the lines are connected with each other using the metal complex.

Embodiment 6

In the embodiment 6, anisotropic conductive films (ACF) are laminated to the regions which cover the cut portions and mounting regions of driving IC chip and the FPC and, thereafter, the IC chip mounting and the FPC mounting are performed. Here, the cut portions are also covered with the FPC to cope with the moisture. Laser beams are radiated from the back side of the transparent insulation substrate thus cutting the inter-pad short-circuiting lines. However, the laser output is controlled not to bring about the disconnection of the FPC lines. Alternatively, the lines are not formed on the cut regions on the FPC substrate side. According to this embodiment, the resin applying becomes no more necessary and the cut portions can be covered with the FPC and hence, the liquid crystal panel becomes further compact.

Figure 22:
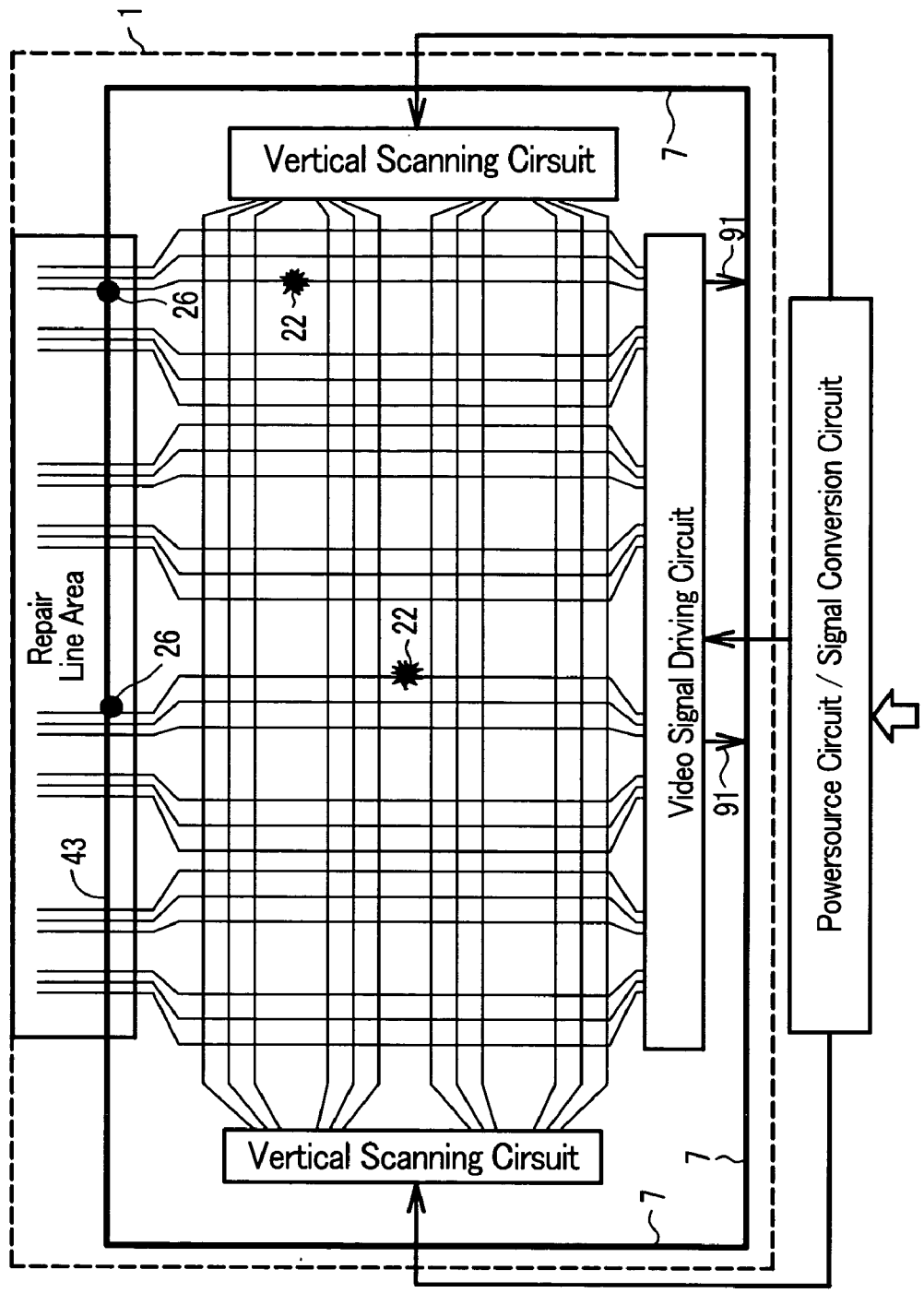
FIG. 22 is an explanatory view of a liquid crystal panel and a peripheral circuit according to the present invention.

FIG. 22 is an explanatory view of the liquid crystal panel and the peripheral circuit according to the present invention. Here, only the TFT substrate is shown. Inside the short-circuiting lines 7 for static electricity of the TFT substrate 1, a video signal driving circuit (IC chip) and a vertical scanning circuit (IC chip) are mounted by COG mounting. To these video signal driving circuit (drain signal line driving circuit) and a vertical scanning circuit (gate signal line driving circuit), given voltages and signals are supplied from a power source circuit/signal conversion circuit which is arranged outside the liquid crystal panel. The power source circuit/signal conversion circuit receives display signals, timing signals and the like from a host computer side and converts these signals into signals necessary for drain signal line driving and gate signal line driving.

Figure 23:
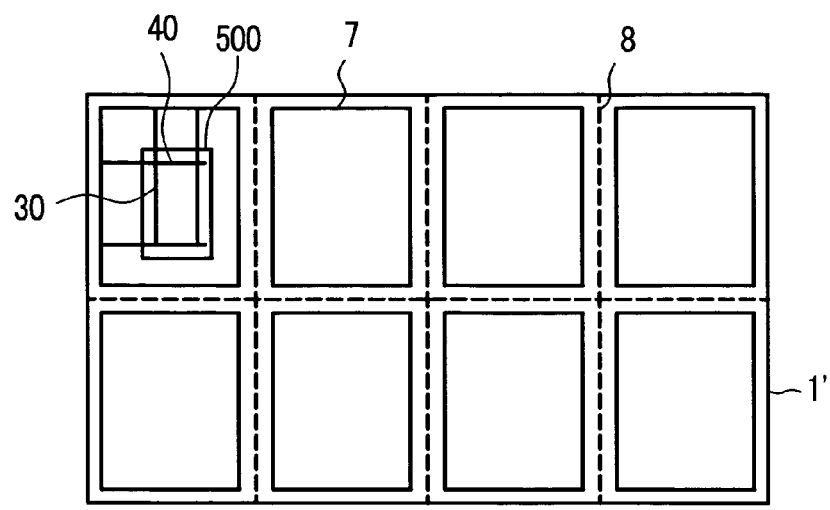
FIG. 23 is an explanatory view of a substrate cut line of a liquid crystal panel according to the present invention.
Figure 25:
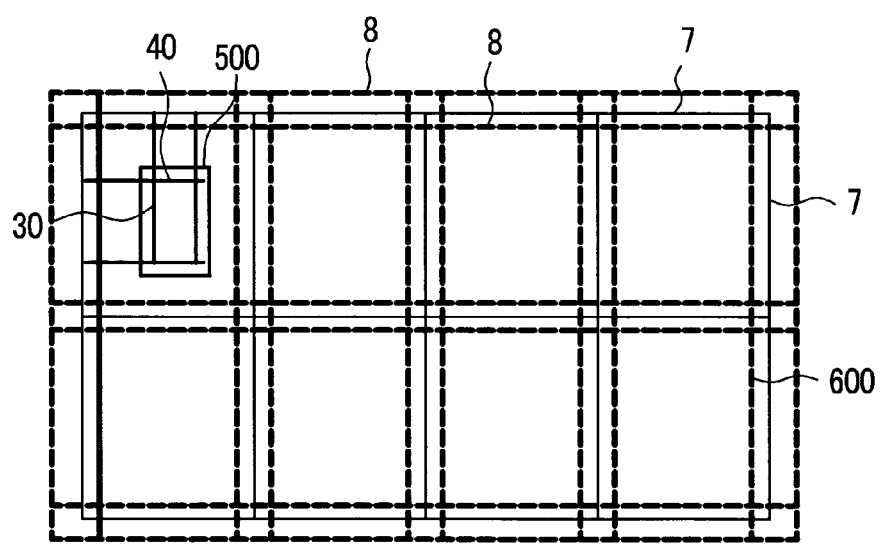
FIG. 25 is an explanatory view of substrate cutting of a conventional liquid crystal panel.

FIG. 23 is an explanatory view of TFT substrate cut lines according to the present invention. In a glass substrate 1' having a large size for TFT substrate, a plurality of liquid crystal panels (8 pieces in FIG. 23) are built. Outside matrix portions (display regions) 500 each having pixels at crossing portions of the gate signal lines 30 and the drain signal lines 40, the short-circuiting lines 7 for static electricity are arranged. The substrate cut lines 8 are arranged at positions which are around the short-circuiting lines 7 for static electricity and can divide the individual liquid crystal panels.

Here, although the description has been made with respect to the liquid crystal display device in respective embodiments, the present invention is not always limited to the liquid crystal display device and the present invention is applicable to a device which uses the thin film transistor matrix such as an organic EL display device or a display device which incorporates a low-temperature poly-silicon driving circuit therein.

What is claimed is:

1. An active matrix type display device, comprising:
    an image display region;
    a peripheral region which surrounds the image display region on an insulation substrate;
    a plurality of thin film transistors which are arranged in the image display region;
    a plurality of signal lines which supply signals to the thin film transistors; and
    connection pads which are arranged in the peripheral region and are connected with one ends of the signal lines,
    wherein the peripheral region of the insulation substrate includes short-circuiting lines which are arranged to face a first end portion of the substrate outside the connection pads and inter-pad short-circuiting lines which extend toward the first end portion of the insulation substrate from the connection pads, each of the inter-pad short-circuiting lines being connected with one of the short-circuiting lines, and
    a cut region which cuts electric connection between at least two of the plurality of inter-pad short-circuiting lines and at least two of the short-circuiting lines is arranged outside the connection pads and inside the short-circuiting lines and leaves electric connection between at least one of the inter-pad short-circuiting lines and at least one of the short-circuiting lines.

2. An active matrix type display device according to claim 1, wherein the display device includes a flexible circuit board which is laminated to cover at least a part of the short-circuiting lines, and the line of the flexible circuit board is electrically connected with a connection terminal portion of each of the one or more short-circuiting lines.

3. An active matrix type display device comprising:
    an insulation substrate;
    a display part which comprises a plurality of thin film transistors and a plurality of signal lines which supply signals to the thin film transistors which are arranged in a matrix array on the substrate;
    a plurality of input lines which supply electric signals to the plurality of signal lines;
    an IC chip for driving the thin film transistors which is formed on the substrate and is electrically connected with the plurality of input lines using chip-on-glass mounting;
    inter-pad short-circuiting lines which pass below the IC chip; and
    short-circuiting lines which are arranged outside a region where the IC chip is mounted and inside an end portion of the substrate, and electrically connect the interpad short-circuiting lines with each other,
    wherein a cut region which cuts electric connection between at least two of the plurality of inter-pad short-circuiting lines and at least two of the short-circuiting lines is arranged outside the region where the IC chip is mounted and inside the short-circuiting lines.

4. An active matrix type display device according to claim 3, wherein the short-circuiting lines are short-circuiting lines for static electricity.

5. An active matrix type display device according to claim 3, wherein the cut region leaves the electric connection between at least one of the inter-pad short-circuiting lines and one of the short-circuiting lines, so that one of the signal lines is electrically connected with the one of the short-circuiting lines using a precipitated metal complex or a laser skipping technique.

6. An active matrix type display device according to claim 3, wherein the short-circuiting lines are formed of a plurality of lines which correspond to each color.

7. An active matrix type display device according to claim 3, wherein the display device further includes:
    extension lines which extend toward a second end portion of the insulation substrate and are connected with the signal lines; and
    repair lines which extend inside and along the second end portion of the substrate, the extension lines and the repair lines are formed outside a sealing portion of the substrate, and at least one of the signal lines to be repaired is electrically connected with at least one of the repair lines using a precipitated metal complex.

8. An active matrix type display device according to claim 3, wherein the insulation substrate is a plastic substrate or a bendable substrate.

9. An active matrix type display device comprising:

an insulation substrate;

a display part which comprises a plurality of thin film transistors and a plurality of signal lines which supply signals to the thin film transistors which are arranged in a matrix array on the substrate;

a plurality of input lines which supply electric signals to the plurality of signal lines;

connection pads which electrically connect output terminals of an IC chip and the plurality of input lines;

inter-pad short-circuiting lines which are electrically connected with the respective input lines and are arranged outside the connection pads; and short-circuiting lines which comprise lines for static electricity and branched short-circuiting lines and are arranged outside the connection pads and inside an end portion of the substrate, wherein a cut region where the electric connection between the plurality of inter-pad short-circuiting lines and the short-circuiting lines is cut is arranged outside the connection pads and inside the short-circuiting lines.

10. An active matrix type display device according to claim 9, wherein the connection pads are terminal portions which electrically connect a flexible printed circuit board on which an IC chip for driving the thin film transistors is mounted and the plurality of input lines.

11. An active matrix type display device according to claim 9, wherein a flexible printed circuit board is laminated to cover the short-circuiting lines or to cover the short-circuiting lines and the cut region.

12. An active matrix type display device according to claim 9, wherein an inter-line connection pattern of a flexible printed circuit board is formed on the substrate.

13. An active matrix type display device according to claim 9, wherein at least one of the branched short-circuiting lines has a U-shape.

14. An active matrix type display device according to claim 9, wherein the short-circuiting lines are formed of a plurality of lines which correspond to each color.

15. An active matrix type display device according to claim 9, wherein the cut region leaves electric connection between at least one of the inter-pad short-circuiting lines and at least one of the short-circuiting lines so that one of the signal lines is electrically connected with the one of the short-circuiting lines using a precipitated metal complex or a laser skinning technique.

16. An active matrix type display device according to claim 9, wherein the insulation substrate is a plastic substrate or a bendable substrate.

17. An active matrix type display device according to claim 3, wherein the short-circuiting lines are branched short-circuiting lines.

18. An active matrix type display device according to claim 17, wherein at least one of the branched short-circuiting lines has a U-shape.

* * * * *